(12) United States Patent
Benmouyal et al.

(10) Patent No.: US 10,197,614 B2
(45) Date of Patent: Feb. 5, 2019

(54) FAULT LOCATION DURING POLE-OPEN CONDITION

(71) Applicant: Schweitzer Engineering Laboratories, Inc., Pullman, WA (US)

(72) Inventors: Gabriel Benmouyal, Boucherville (CA); Brian A. Smyth, Butte, MT (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 80 days.

(21) Appl. No.: 15/143,938

(22) Filed: May 2, 2016

(65) Prior Publication Data
US 2017/0315168 A1 Nov. 2, 2017

(51) Int. Cl.
*G01R 31/08* (2006.01)

(52) U.S. Cl.
CPC .................. *G01R 31/085* (2013.01)

(58) Field of Classification Search
CPC ...... G01R 31/08; G01R 31/40; G01R 31/025; G01R 31/085; G01R 31/086; G01R 22/068; G01R 29/085; G01R 31/02; G01R 31/1272; G01R 31/2836; G01R 31/318342; G01R 31/3275
USPC .......................... 702/44, 58, 59, 60, 61, 185
See application file for complete search history.

(56) References Cited

U.S. PATENT DOCUMENTS

| 4,161,011 | A | 7/1979 | Wilkinson |
| 4,405,966 | A | 8/1983 | Cavero |
| 4,825,327 | A | 4/1989 | Alexander |
| 5,140,492 | A | 8/1992 | Schweitzer |
| 5,703,745 | A | 12/1997 | Roberts |
| 6,028,754 | A | 2/2000 | Guzman-Casillas |
| 6,721,671 | B2 | 4/2004 | Roberts |
| 7,660,088 | B2 | 2/2010 | Mooney |
| 8,410,785 | B2 | 4/2013 | Calero |
| 8,736,297 | B2 | 5/2014 | Yelgin |
| 8,942,954 | B2 | 1/2015 | Gong |
| 9,257,827 | B2 | 2/2016 | Calero |
| 2009/0150099 | A1* | 6/2009 | Balcerek .............. G01R 31/086 702/59 |
| 2011/0264389 | A1* | 10/2011 | Mynam ................ G01R 31/086 702/58 |
| 2012/0004867 | A1* | 1/2012 | Mousavi ............ G01R 31/3274 702/58 |
| 2014/0236502 | A1* | 8/2014 | Calero ................. H02H 1/0092 702/58 |

(Continued)

OTHER PUBLICATIONS

Edmund O. Schweitzer, III, Evaluation and Development of Transmission Line Fault Locating Techniques Which Use Sinusoidal Steady-State Information, 9th Annual Western Protective Relay Conference, Oct. 26-28, 1982.

(Continued)

*Primary Examiner* — Shahed Ahmed
(74) *Attorney, Agent, or Firm* — Justin K. Flanagan; Bradley W. Schield

(57) ABSTRACT

The present disclosure illustrates the errors that are encountered when using both single-ended and double-ended normal-mode fault location calculations when a fault occurs in a pole-open condition. The disclosure provides systems and methods for accurately calculating the location of faults that occur during pole-open conditions, including single-ended approaches and double-ended approaches.

21 Claims, 19 Drawing Sheets

(56) References Cited

U.S. PATENT DOCUMENTS

2014/0351472 A1* 11/2014 Jebson .................... G06F 13/24
                                                                710/269
2017/0003335 A1* 1/2017 Kang ................... G01R 31/085
2017/0227611 A1* 8/2017 Xu ......................... G01R 31/40

OTHER PUBLICATIONS

Yanfeng Gong, Mangapathirao Mynam, Armando Guzman, Gabriel Benmouyal, Boris Shulim, Automated Fault Location System for Nonhomogeneous Transmission Networks, 37th Annual Western Protective Relay Conference, Oct. 19-21, 2010.

Gabriel Benmouyal, Jeff Roberts, Superimposed Quantities: Their True Nature and Application in Relays, 26th Annual Western Protective Relay Conference, Oct. 26-28, 1999.

Fernando Calero, Daqing Hou, Practical Single-Pole Line Protection Scheme Considerations, 31st Annual Western Protective Relay Conference, Oct. 19-21, 2004.

Gabriel Benmouyal, Armando Guzman, Rob Jain, Tutorial on the Impact of Network Parameters on Distance Element Resistance Coverage, 40th Annual Western Protective Relay Conference Oct. 15-17, 2013.

E.O. Schweitzer, III, Armando Guzman, Mangapathirao Mynam, Veselin Skendic, Bogdan Kasztenny, Stephen Marx, Locating Faults by the Traveling Waves They Launch, 40th Annual Western Protective Relay Conference Oct. 15-17, 2013.

Tony Jiao, Charles Henville, Evolving Transmission Line Faults While Single Phase Open, 41st Annual Western Protective Relay Conference, Oct. 13-16, 2014.

* cited by examiner

FAULT LOCATION DURING POLE-OPEN CONDITION

TECHNICAL FIELD

This disclosure relates to identifying fault locations on a transmission line. More particularly, this disclosure provides systems and methods for determining a fault location during a pole-open condition.

BRIEF DESCRIPTION OF THE DRAWINGS

Non-limiting and non-exhaustive embodiments of the disclosure are described herein, including various embodiments of the disclosure with reference to the figures listed below.

Figure 1:
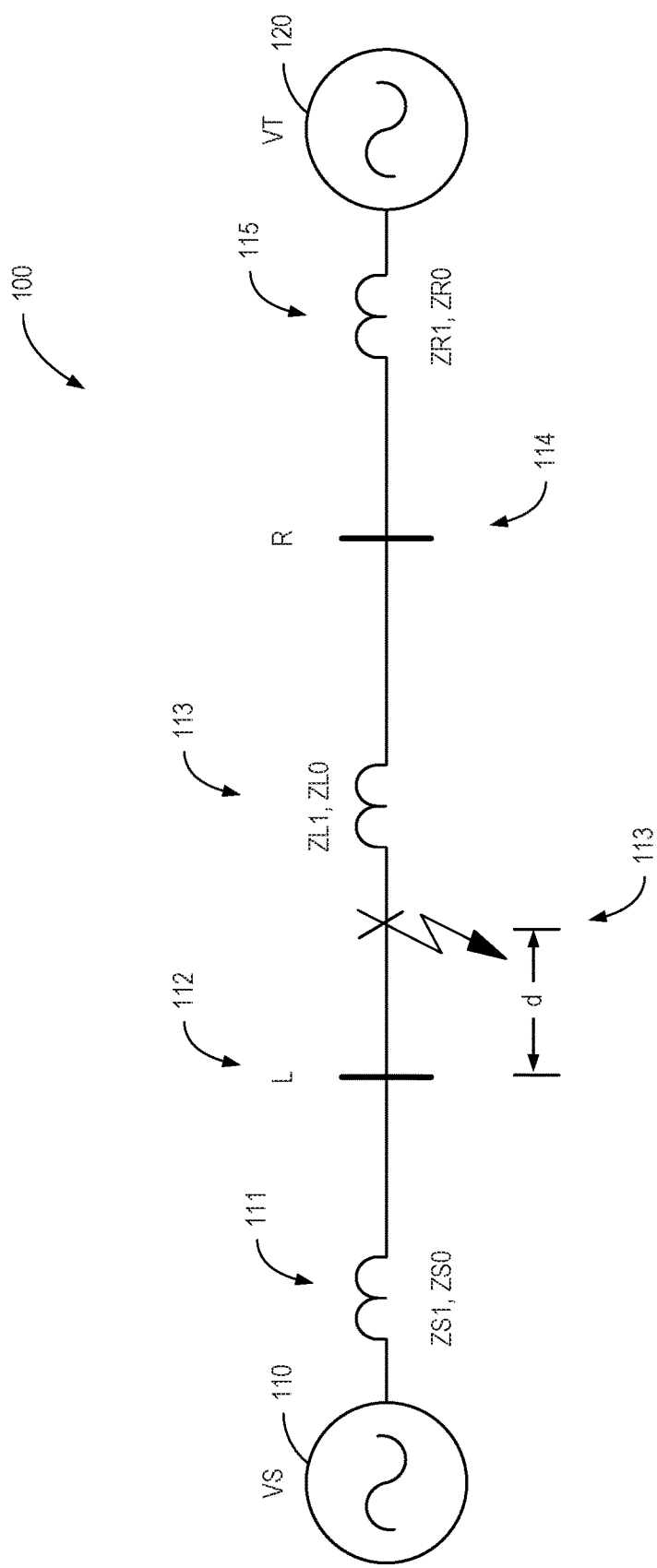
FIG. 1 illustrates a simplified diagram of a generic single-line power system with a fault at a location, d.

In the following description, numerous specific details are provided for a thorough understanding of the various embodiments disclosed herein. The systems and methods disclosed herein can be practiced without one or more of the specific details, or with other methods, components, materials, etc. In addition, in some cases, well-known structures, materials, or operations may not be shown or described in detail in order to avoid obscuring aspects of the disclosure. Furthermore, the described features, structures, or characteristics may be combined in any suitable manner in one or more alternative embodiments.

DETAILED DESCRIPTION

This disclosure provides methods and systems to accurately locate a fault during a pole-open condition. Power distribution and protection equipment may include fault location technology to identify the location of a fault along a transmission line. Both single-ended and double-ended fault location determination equipment traditionally makes the assumption that all the three poles (i.e., phase lines) of a three-phase power transmission system are closed. Traditional fault location determination systems and methods use measured and calculated data from a single sequence network.

Conventional fault location calculations, whether based on single-ended or double-ended data, exhibit significant errors following a pole-open condition because they rely on data from a single sequence network. These systems are particularly inaccurate if prefault sequence currents (negative or zero) are present, such as when the fault resistance increases so that the sequence current during the fault becomes comparable to the sequence current existing before the fault.

The present disclosure provides systems and methods that utilize the combined information from two sequence networks, positive and negative, to achieve accuracy comparable to the normal-mode (three pole closed) conditions for both normal-mode and pole-open modes. Whereas the single sequence network approach ignores the voltage difference across the open breaker pole in a double-ended calculation, a dual-sequence network approach compensates for the voltage potential across the open breaker pole.

The fault location systems and methods describe herein utilize or may utilize impedance-based techniques and process all six voltage and current waveforms from a single end or both ends of a transmission line and do not rely on wave-based fault location techniques.

In a single-ended fault location system, during a pole-open condition, the distance to the fault can be determined by using the voltages and currents on each phase. A voltage sensor may detect the voltage for the faulted loop, VAL. A current sensor (e.g., a current transformer) may detect a prefault zero-sequence current, $I0L_{pref}$. A prefault zero-sequence current may be determined during the pole-open condition before any other fault occurs. $I0L_{pref}$ may be stored in memory by a fault location system. The current sensor may also detect a zero-sequence current, I0L, during the fault and calculate a current for the faulted loop, $I_{AG}$.

Other values such as impedance and phase angles may be calculated, measured, and/or looked up in a table. For example, the line positive-sequence impedance, ZL1, may be measured or calculated using voltage and/or current measurements. Finally, a current distribution factor phase angle, $e^{-j\psi_0}$, may be calculated by using the impedances of both the positive-sequence and zero-sequence networks.

Using these values, a single-ended fault location system may determine the distance to a fault. The distance may be calculated by finding the difference, $\Delta I0L$, of I0L and $I0L_{pref}$, multiplying the difference, $\Delta I0L$, by $e^{-j\psi_0}$, and multiplying the conjugate of that product by VAL. The imaginary portion of the resulting product may be divided by the imaginary portion of the product of ZL1, $I_{AG}$, and the conjugate of the product of $\Delta I0L$ and $e^{-j\psi_0}$, such that:

$$d = \frac{\text{Im}[VAL \cdot conj(\Delta I0L \cdot e^{-j\psi_0})]}{\text{Im}[ZL1 \cdot I_{AG} \cdot conj(\Delta I0L \cdot e^{-j\psi_0})]} \quad \text{Equation 1}$$

Equation 1 is different from those currently used to find faults in normal mode with all three phases closed. One difference is that for a pole-open condition, the incremental quantity of the zero-sequence current may be used (i.e., the difference between the prefault zero-sequence current existing during the pole-open condition and the zero-sequence current during/after the fault). The current distribution factor phase angle may be found using the impedances of both the positive-sequence and zero-sequence networks.

In a double-ended fault location system, during a pole-open condition the distance to the fault can be determined by using a compensated and corrected equation. In a double-ended fault location system the voltages and currents on each phase at both ends of a line may be used. To accurately locate the fault, the negative-sequence network may be expressed as an equation. Additionally or alternatively, the positive-sequence network may provide an equivalent sequence voltage. The equivalent sequence voltage may be extracted from the positive-sequence network and be used to replace the sequence voltage term in the negative-sequence network equation. For example, if phase B is pole-open the distance may be expressed as:

$$d = \frac{(V2L - V2R) + ZL1(I2R - a \cdot I1R) - a(V1L - V1R)}{ZL1(I2L + I2R) - a \cdot ZL1(I1L + I1R)} \quad \text{Equation 2}$$

As another example, if phase A was open the distance may be expressed as:

$$d = \frac{(V2L - V2R) + ZL1(I2R - I1R) - (V1L - V1R)}{ZL1(I2L + I2R) - ZL1(I1L + I1R)} \quad \text{Equation 3}$$

As another example, if phase C was open the distance may be expressed as:

$$d = \frac{(V2L - V2R) + ZL1(I2R - a^2 \cdot I1R) - a^2(V1L - V1R)}{ZL1(I2L + I2R) - a^2 \cdot ZL1(I1L + I1R)} \quad \text{Equation 4}$$

Additional details and examples are provided with reference to the figures below. Generally speaking, the systems and methods disclosed herein may be adapted to interface with or be included as part of a protection element or protection ecosystem, such as a power system protection relay. Such protection devices may be configured to communicate with, control, operate, energize, de-energize, and/or disengage one or more power system components and provide an indication of where a potential fault has occurred. Protection relays may be installed in electric power transmission and distribution facilities to detect overloads, short circuits, and other fault conditions.

Many embodiments of a protective relay include electronic devices employing FPGAs, microcontrollers, CPUs, A/D converters, electronic displays, communication ports, and other electronic devices and systems to digitize power system current and/or voltage measurements, and process data associated with the digitized currents and voltages according to various algorithms and/or digital filters. A protective relay may be configured to make protection decisions based on data associated with a digitized power system's currents and/or voltages, and may communicate decisions made by a protective relay to an appropriate system or personnel, and/or may otherwise cause a suitable response to the digitized power system's currents and/or voltages.

An intelligent electronic device (IED), which may be used for monitoring, protecting, and/or controlling industrial and utility equipment, such as in electric power delivery systems may include system components to implement a method for identifying fault locations using the two sequence network approaches described herein. Such IEDs may be configured to use a single-ended two sequence network approach or a double-ended two sequence network approach. In both of these embodiments, the IED is able to provide accurate fault location information even during a pole-open event.

The phrases "connected to" and "in communication with" refer to any form of interaction between two or more components, including mechanical, electrical, magnetic, and electromagnetic interaction. Two components may be connected to each other, even though they are not in direct contact with each other, and even though there may be intermediary devices between the two components.

As used herein, the term IED may refer to any microprocessor-based device that monitors, controls, automates, and/or protects monitored equipment within a system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, motor drives, and the like. IEDs may be connected to a network, and communication on the network may be facilitated by networking devices including, but not limited to, multiplexers, routers, hubs, gateways, firewalls, and switches. Furthermore, networking and communication devices may be incorporated in an IED or be in communication with an IED. The term IED may be used interchangeably to describe an individual IED or a system comprising multiple IEDs.

Some of the infrastructure that can be used with embodiments disclosed herein is already available, such as: general-purpose computers, computer programming tools and techniques, digital storage media, and communications networks. A computer may include a processor, such as a microprocessor, microcontroller, logic circuitry, or the like. The processor may include a special-purpose processing device, such as an ASIC, PAL, PLA, PLD, CPLD, Field Programmable Gate Array (FPGA), or other customized or programmable device. The computer may also include a computer-readable storage device, such as non-volatile memory, static RAM, dynamic RAM, ROM, CD-ROM, disk, tape, magnetic, optical, flash memory, or other computer-readable storage medium.

Suitable networks for configuration and/or use, as described herein, include any of a wide variety of network infrastructures. Specifically, a network may incorporate landlines, wireless communication, optical connections, various modulators, demodulators, small form-factor pluggable (SFP) transceivers, routers, hubs, switches, and/or other networking equipment.

The network may include communications or networking software, such as software available from Novell, Microsoft, Artisoft, and other vendors, and may operate using TCP/IP, SPX, IPX, SONET, and other protocols over twisted pair, coaxial, or optical fiber cables, telephone lines, satellites, microwave relays, modulated AC power lines, physical media transfer, wireless radio links, and/or other data transmission "wires." The network may encompass smaller networks and/or be connectable to other networks through a gateway or similar mechanism.

Aspects of certain embodiments described herein may be implemented as software modules or components. As used herein, a software module or component may include any type of computer instruction or computer-executable code located within or on a computer-readable storage medium, such as a non-transitory computer-readable medium. A software module may, for instance, comprise one or more physical or logical blocks of computer instructions, which may be organized as a routine, program, object, component, data structure, etc., that perform one or more tasks or implement particular data types, algorithms, and/or methods.

A particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media. Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network.

The embodiments of the disclosure can be understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments.

FIG. 1 illustrates a simplified diagram of single-line power system 100 with a fault at a location, d. The single-line power system is modeled as a voltage VS 110 connected to a transmission line with an impedance ZS1/ZS0 111 between the power source VS 110 and a left bus L 112. The transmission line may have an impedance ZL1/ZL0 113 between the left bus L 112 and a right bus R 114. A fault location 113 a distance d from the left bus L 112 is shown as well. The transmission line may have an impedance ZR1/ZR0 115 between the right bus R 114 and a voltage VT 120.

The apparent loop impedance, $Z_{LP}$, as seen from the left bus L 112 for any of the three ground fault loops and three phase fault loops can be expressed by the following equation with reference to FIG. 1:

$$Z_{LP} = \frac{V_{LP}}{I_{LP}} = d \cdot ZL1 + Rf \frac{K_{LP}}{K_I} \quad \text{Equation 5}$$

$V_{LP}$ and $I_{LP}$ represent the voltage and current relative to the particular faulted loop with reference to FIG. 1. The distance, d, in Equation 5 and FIG. 1 is the distance to the fault in per unit (pu) line length. ZL1 is the line positive-sequence impedance and Rf is the fault resistance. $K_{LP}$ is a network parameter and K is the ratio of the faulted loop current over the change of the same current. Voltage and current values corresponding to various $K_{LP}$ factors are described in "Tutorial on the Impact of Network Parameters on Distance Element Resistance Coverage" by G. Benmouyal, A Guzmán, and R. Jain, published in the 40th Annual Western Protective Relay Conference, Spokane, Wash., October 2013.

With reference to FIG. 1 and Equation 5 above, the following variables are defined:

$$V_{LP} = V_{AG} = VAL \quad \text{Equation 6}$$
$$I_{LP} = I_{AG} = IAL + K_0 \cdot I0L$$

$$K_{LP} = K_{AG} = \frac{3}{2C1 + C0(1 + K_0)} \quad \text{Equation 7}$$

$$K_I = \frac{I_{LP}}{I_{LP} - I_{LD}} = \frac{I_{LP}}{\Delta I_{LP}} = \frac{(IAL + K_0 \cdot I0L)}{(IAL + K_0 \cdot I0L) - I_{LD}} \quad \text{Equation 8}$$

The zero-sequence compensation factor for Equation 6 above is defined as:

$$K_0 = \frac{ZL0 - ZL1}{ZL1} \quad \text{Equation 9}$$

In Equation 7 above, C1 is the positive-sequence current distribution factor as seen from the left bus L 112. C2 is the negative-sequence current distribution factor and is equal to C1. C0 is the zero-sequence network current distribution factor. All three quantities are provided as:

$$C1 = C2 = \frac{(1-d)ZL1 + ZR1}{ZL1 + ZS1 + ZR1} \quad \text{Equation 10}$$

$$C0 = \frac{(1-d)ZL0 + ZR0}{ZL0 + ZS0 + ZR0} \quad \text{Equation 11}$$

In Equation 8 above, $I_{LD}$ is the load or the prefault loop current. For a phase-A-to-ground fault, the prefault current is calculated as:

$$I_{AG\_pf} = \frac{VS - VT}{ZL1 + ZS1 + ZR1} \qquad \text{Equation 12}$$

According to the Takagi principle, the normal-mode, single-sequence distance calculation is based on the voltage of the primary loop as follows:

$$V_{LP} = d \cdot ZL1 \cdot I_{LP} + Rf \cdot K_{LP}(I_{LP} - I_{LD}) \qquad \text{Equation 13}$$

The normal-mode, single-ended fault location calculation using the Takagi principle makes the assumption that the $K_{LP}$ is a pure real number which results in a distance equation:

$$d = \frac{\text{Im}[V_{LP} \cdot conj(\Delta I_{LP})]}{\text{Im}[ZL1 \cdot I_{LP} \cdot conj(\Delta I_{LP})]} \qquad \text{Equation 14}$$

A Takagi method for finding the fault current distance, d, is susceptible to errors because of the assumption that the factor $K_{LP}$ is a real number. One approach to compensate for these errors includes introducing a tilt angle, θ, (e.g., a tilt factor or tilt value) to compensate for the phase angle factor that is neglected in Equation 14. The distance, d, to the fault according to such an embodiment is expressed below:

$$d = \frac{\text{Im}[V_{LP} \cdot conj(\Delta I_{LP} \cdot e^{j\theta})]}{\text{Im}[ZL1 \cdot I_{LP} \cdot conj(\Delta I_{LP} \cdot e^{j\theta})]} \qquad \text{Equation 15}$$

The value of the tilt angle, θ, is a function of the distance, d, to the fault. If an accurate knowledge of the network impedances is available, an iterative approach can be used to solve for the title angle, θ. In other embodiments, a single value for the tilt angle, θ, is used for the entire range of the distance, d.

For certain fault types, such as single-phase-to-ground faults, it is possible to eliminate the prefault current by expressing the voltage of the faulted impedance loop as a function of the total current at the fault, as expressed below:

$$V_{AG} = d \cdot ZL_1 \cdot I_{AG} + 3Rf \cdot I1F \qquad \text{Equation 16}$$

For single phase-A-to-ground faults, the fault location for the total sequence currents can be expressed as:

$$I1F = I2F = I0F \qquad \text{Equation 17}$$

The negative- and zero-sequence currents from the left bus L 112 can be expressed as functions of the total negative-sequence and zero-sequence currents at the fault as follows:

$$I2L = C2 \cdot I2F$$

$$I0L = C0 \cdot I0F \qquad \text{Equation 18}$$

Accordingly, the voltage of the faulted impedance loop for the phase-A-to-ground fault can be expressed as a function of the zero-sequence current:

$$V_{AG} = d \cdot ZL1 \cdot I_{AG} + 3Rf \cdot \frac{I0L}{C0} \qquad \text{Equation 19}$$

Using the identity:

$$\text{Im}\left(\frac{I0L \cdot conj(I0L \cdot e^{-j\phi_0})}{|C0| \cdot e^{j\phi_0}}\right) = \text{Im}\left(\frac{I0L^2}{|C0|}\right) = 0$$

The distance to the fault can be expressed as:

$$d = \frac{\text{Im}[V_{AG} \cdot conj(I0L \cdot e^{-j\phi_0})]}{\text{Im}[ZL1 \cdot I_{AG} \cdot conj(I0L \cdot e^{-j\phi_0})]} \qquad \text{Equation 20}$$

The same reasoning can be applied using the negative-sequence current to develop the equation:

$$d = \frac{\text{Im}[V_{AG} \cdot conj(I2L \cdot e^{-j\phi_2})]}{\text{Im}[ZL1 \cdot I_{AG} \cdot conj(I2L \cdot e^{-j\phi_2})]} \qquad \text{Equation 21}$$

Equivalent expressions can be made for phase-B-to-ground or phase-C-to-ground faults by introducing the corresponding loop voltages and currents.

The equations above, in the context of the problem shown in FIG. 1, are accurate for normal-mode events where all three phases are closed. However, the equations and approaches described above are susceptible to significant errors in the calculation of the distance, d, to the fault during a pole-open fault event.

Specifically, Equation 18 above accurately represents the sequence currents during a normal-mode fault event (i.e., an event that occurs when all three phases are closed). However, during a pole-open fault event, Equation 18 does not accurately represent the sequence currents.

To demonstrate this shortcoming of the normal-mode approach to a pole-open fault event, the analysis below uses the single-line diagram of FIG. 1 and assumed a phase-B pole-open condition.

Figure 2:
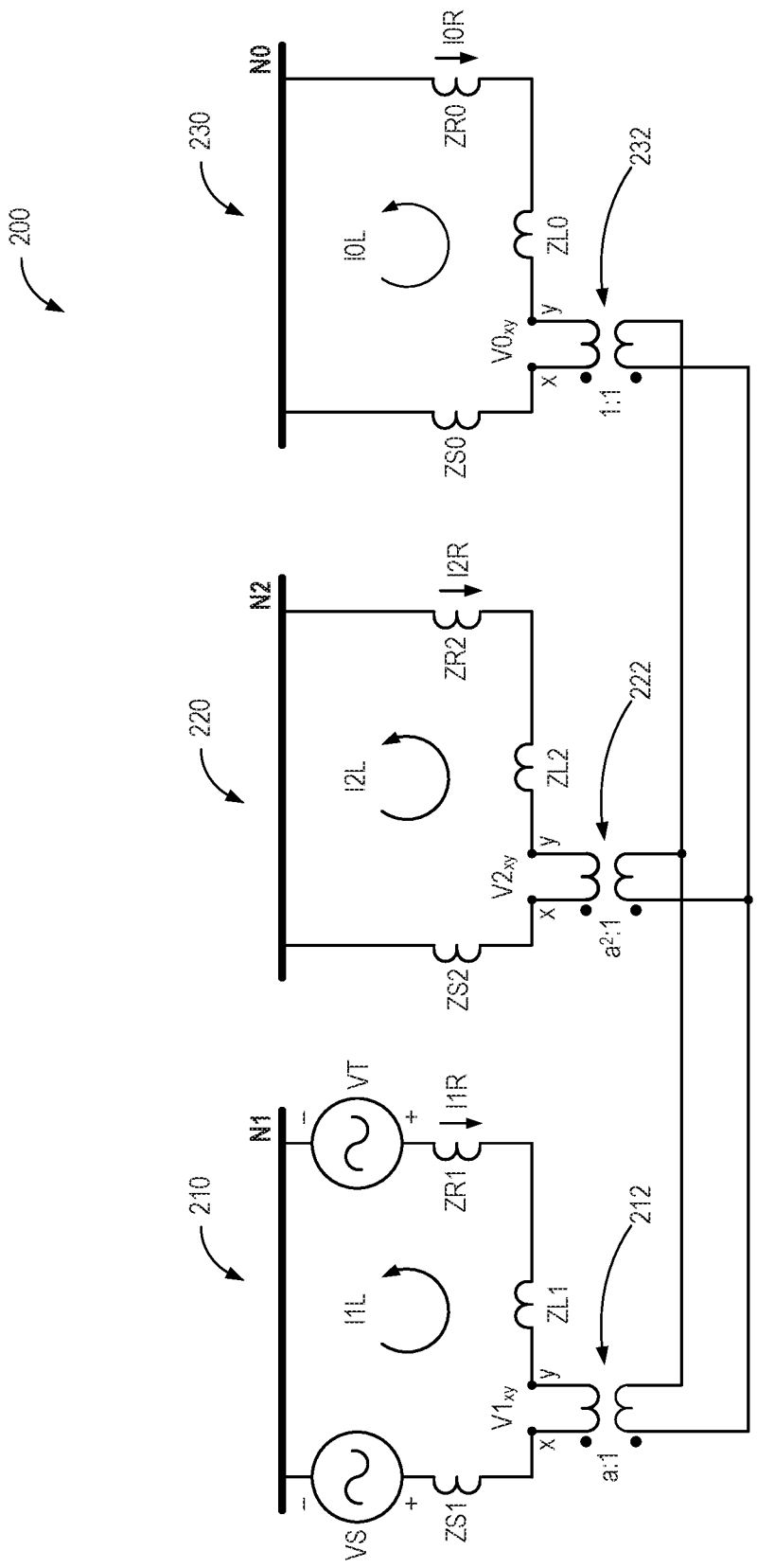
FIG. 2 illustrates a simplified diagram of a sequence network for a phase B pole-open condition, according to one embodiment.

FIG. 2 illustrates a simplified diagram of a sequence network 200 for a phase B pole-open condition, according to one embodiment. Expressing the pole-open condition as phase B being open between two points, x and y, the sequence voltages can be expressed as follows:

$$\begin{pmatrix} V1_{xy} \\ V2_{xy} \\ V0_{xy} \end{pmatrix} = \frac{1}{3} \cdot \begin{pmatrix} 1 & a & a^2 \\ 1 & a^2 & a \\ 1 & 1 & 1 \end{pmatrix} \cdot \begin{pmatrix} VA_{xy} \\ VB_{xy} \\ VC_{xy} \end{pmatrix} \qquad \text{Equation 22}$$

In Equation 22, a is the conventional complex operator $1\angle 120°$. Since $VA_{xy}$ and $VC_{xy}$ are zero, the sequences can be expressed as:

$$V1_{xy} = \left(\frac{1}{3}\right) a VB_{xy}$$

$$V2_{xy} = \left(\frac{1}{3}\right) a^2 VB_{xy} \qquad \text{Equation 23}$$

$$V0_{xy} = \left(\frac{1}{3}\right) VB_{xy}$$

The current constraint is expressed by the condition that the phase B current must be equal to zero or:

$$IB = a^2 I1L + a I2L + I0L = 0 \qquad \text{Equation 24}$$

A plurality ideal transformers 212, 222, and 232 represented in the sequence network of FIG. 2 implement the two voltage and current constraints for a positive-sequence loop 210, a negative-sequence loop 220, and a zero-sequence loop 230.

The sequence network of the phase B pole-open condition of FIG. 2 is provided below:

$$\begin{pmatrix} ZL1+ZS1+ZR1 & 0 & 0 & a \\ 0 & ZL1+ZS1+ZR1 & 0 & a^2 \\ 0 & 0 & ZL0+ZS0+ZR0 & 1 \\ a^2 & a & 1 & 0 \end{pmatrix} \cdot \begin{pmatrix} I1L \\ I2L \\ I0L \\ \left(\frac{1}{3}\right)VB_{xy} \end{pmatrix} =$$

Equation 25

-continued $$\begin{pmatrix} VL-VR \\ 0 \\ 0 \\ 0 \end{pmatrix}$$

Using the following defined variables, the sequence currents of the sequence network of FIG. 2 can be determined:

$$\Delta V = VS - VT$$

$$m = ZL1 + ZS1 + ZR1 = ZL2 + ZS2 + ZR2$$

$$n = ZL0 + ZS0 + ZR0$$

$$m_1 = -(1-d)ZL1 - ZR1$$

$$n_1 = -(1-d)ZL0 - ZR0$$

$$p = m + m_1 = dZL1 + ZS1 = dZL2 + ZS2$$

$$q = n + n_1 = dZL0 + ZS0 = dZL0 + ZS0 \quad \text{Equation 26}$$

Using a Gaussian elimination process, the three prefault sequence currents can be calculated as follows:

$$I1L_{preflt} = -I1R_{preflt} = \frac{\Delta V(m+n)}{m(m+2n)} \quad \text{Equation 27}$$

$$I2L_{preflt} = -I2R_{preflt} = -\frac{a\Delta Vn}{m(m+2n)} \quad \text{Equation 28}$$

$$I0L_{preflt} = -I0R_{preflt} = -\frac{a^2 \Delta V}{m+2n} \quad \text{Equation 29}$$

The phase A prefault current from the left side can be expressed as the sum of all three sequence currents:

$$IAL_{preflt} = \frac{m\Delta V(1-a^2) + n\Delta V(1-a)}{m(m+2n)} \quad \text{Equation 30}$$

Figure 3:
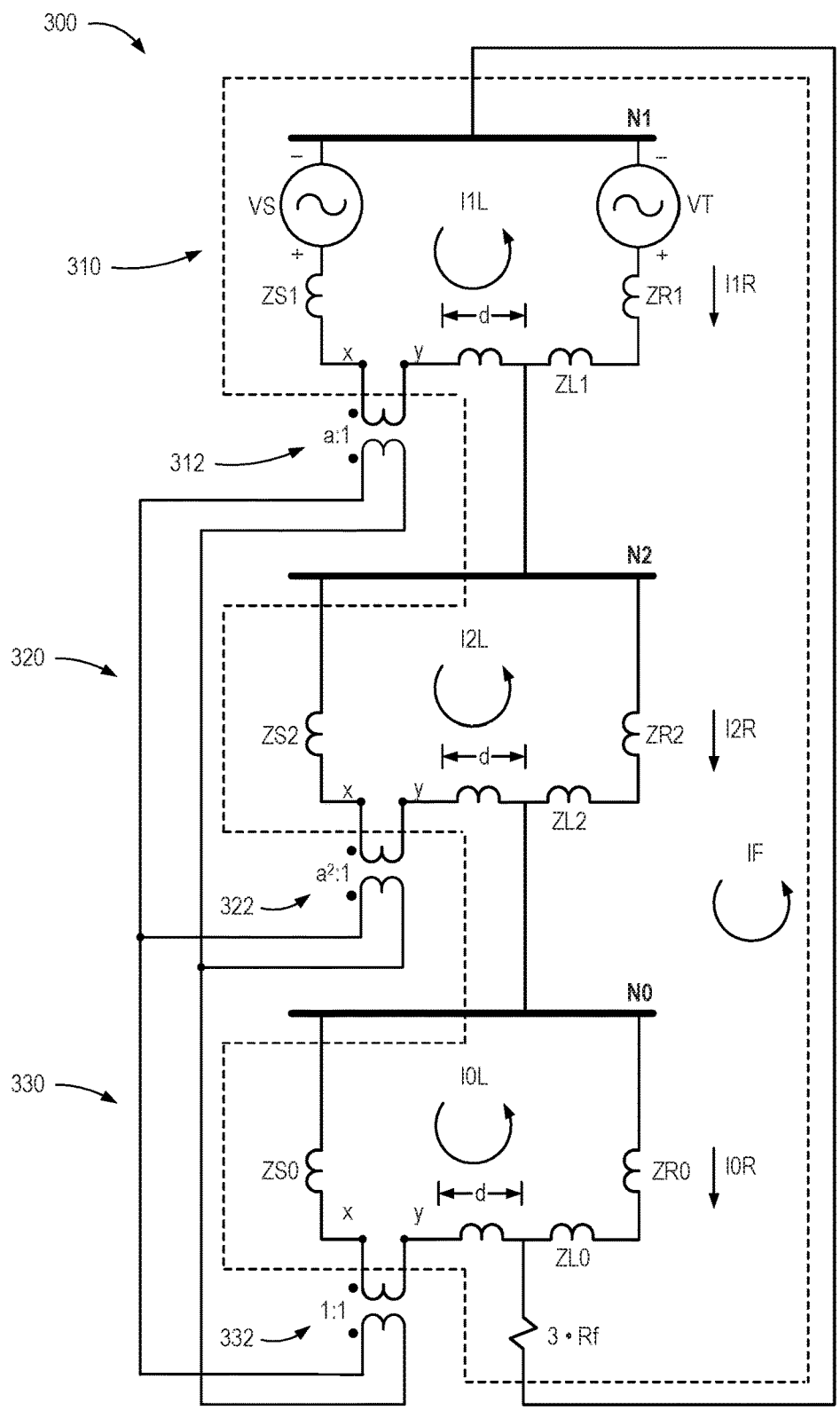
FIG. 3 illustrates a simplified diagram of a sequence network for a phase B pole-open condition showing a phase-A-to-ground fault network, according to one embodiment.

FIG. 3 illustrates a simplified diagram of a sequence network 300 for a phase B pole-open condition showing a phase-A-to-ground fault network, according to one embodiment. FIG. 3 shows a positive-sequence loop 310 with a transformer 312, a negative-sequence loop 320 with a transformer 322, and a zero-sequence loop 330 with a transformer 332. The sequence currents for FIG. 3 can be expressed as:

$$\begin{pmatrix} ZL1+ZS1+ZR1 & 0 & 0 & -(1-d)ZL1-ZR1 & a \\ 0 & ZL2+ZS2+ZR2 & 0 & -(1-d)ZL2-ZR2 & a^2 \\ 0 & 0 & ZL0+ZS0+ZR0 & -(1-d)ZL0-ZR0 & 1 \\ ZS1+dZL1 & ZS2+dZL2 & ZS0+dZL0 & 3R & 0 \\ a^2 & a & 1 & 0 & 0 \end{pmatrix} \begin{pmatrix} I1L \\ I2L \\ I0L \\ IF \\ \left(\frac{1}{3}\right)VB_{xy} \end{pmatrix} = \begin{pmatrix} \Delta V \\ 0 \\ 0 \\ VA \\ 0 \end{pmatrix}$$

Equation 31

$$IF = \frac{-2a^2 m\Delta V(-0.5p-q) - \Delta Vp(1-a)(m+2n) + 2mVA(m+2n)}{2m(-0.5p-q)(m_1+2n_1) - 3pm_1(m+2n) + 6Rfm(m+2n)} \quad \text{Equation 32}$$

The Phase A fault current on the left side is equal to the sum of the three sequence currents:

$$IAL = \frac{\Delta V(m+n)}{m(m+2n)} + \frac{-a\Delta Vn}{m(m+2n)} - \frac{a^2\Delta V}{m+2n} + \left[\left(\frac{a^2}{2} + \frac{a}{2} - 1\right)\left(\frac{m_1+2n_1}{m+2n}\right) + \frac{m_1(a^2-2+a)}{2m}\right]IF \quad \text{Equation 33}$$

The sequence currents at both extremities of the lines are composed of a prefault term and a second term that is proportional to IF, giving the equations:

$$I0L = I0L_{preflt} - \frac{m_1+2n_1}{m+2n}IF \quad \text{Equation 34}$$

$$I2L = I2L_{preflt} + \left(\frac{a^2}{2}\frac{m_1+2n_1}{m+2n} - \frac{m_1(1-a)}{2m}\right)IF \quad \text{Equation 35}$$

$$I1L = I1L_{preflt} + \left(\frac{a}{2}\frac{m_1+2n_1}{m+2n} + \frac{m_1(a^2-1)}{2m}\right)IF \quad \text{Equation 36}$$

The left-side Phase A current can be expressed as:

$$IAL = \quad \text{Equation 37}$$

$$IAL_{preflt} + \left[\left(\frac{a^2}{2} + \frac{a}{2} - 1\right)\left(\frac{m_1+2n_1}{m+2n}\right) + \frac{m_1(a^2-2+a)}{2m}\right]IF$$

Given the identity, $$a^2 + a = -1 \quad \text{Equation 38}$$

Equation 37 can be rewritten as:

$$IAL = IAL_{preflt} - \frac{3}{2}\left(\frac{m_1 + 2n_1}{m + 2n} + \frac{m_1}{m}\right)IF \quad \text{Equation 39}$$

Given that:

$$V1_{xy} + V2_{xy} + V0_{xy} = 0 \quad \text{Equation 40}$$

The voltages around the loop shown as the dashed line in FIG. 3 to drive the equation:

$$V1L + V2L + V0L - d \cdot ZL1 \cdot (I1L + I2L)$$

$$-d \cdot ZL0 \cdot I0L - 3Rf \cdot IF = 0 \quad \text{Equation 41}$$

Adding and subtracting $d \cdot ZL1 \cdot I0L$, results in the following:

$$V1L + V2L + V0L - d \cdot ZL1 \cdot (I1L + I2L + I0L)$$

$$-d \cdot I0L(ZL0 - ZL1)I0L - 3Rf \cdot IF = 0 \quad \text{Equation 42}$$

Thus, if a phase-A-to-ground fault occurs during a phase B pole-open condition, the relation between the voltage and current for the faulted loop, distance to the fault, fault resistance, and total sequence current at the fault point is provided by:

$$VAL = d \cdot ZL1 \cdot (IAL + K_0 \cdot I0L) + 3Rf \cdot IF \quad \text{Equation 43}$$

In Equation 43, IF represents the total sequence current at the fault point in FIG. 3.

Equation 43 for the pole-open condition is similar to Equation 16 for a normal-mode (i.e., the three-pole closed) condition. As previously stated, the sequence currents cannot be accurately calculated using Equation 18. Instead, the relationship between the zero-sequence current at the relay location and the total zero-sequence current at the fault point is given by:

$$I0L = \frac{-a^2 \Delta V}{m + 2n} - \frac{m_1 + 2n_1}{m + 2n} IF \quad \text{Equation 44}$$

The relationship between the negative-sequence current at the relay and the total sequence current is expressed as:

$$I2L = \frac{-a\Delta Vn}{m(m + 2n)} + \left(\frac{a^2}{2}\frac{m_1 + 2n_1}{m + 2n} - \frac{m_1(1-a)}{2m}\right)IF \quad \text{Equation 45}$$

Similarly, the relationship for the positive-sequence current is:

$$I1L = \frac{\Delta V(m+n)}{m(m+2n)} + \left(\frac{a}{2}\frac{m_1 + 2n_1}{m + 2n} + \frac{m_1(a^2 - 1)}{2m}\right)IF \quad \text{Equation 46}$$

The current distribution factors in a phase B pole-open condition may be expressed as:

$$C0_{pob} = |C0_{pob}| \cdot e^{j\Psi_0} = -\frac{m_1 + 2n_1}{m + 2n} \quad \text{Equation 47}$$

$$C2_{pob} = |C2_{pob}| \cdot e^{j\Psi_2} = \left(\frac{a^2}{2}\frac{m_1 + 2n_1}{m + 2n} - \frac{m_1(1-a)}{2m}\right) \quad \text{Equation 48}$$

$$C1_{pob} = |C1_{pob}| \cdot e^{j\Psi_1} = \left(\frac{a}{2}\frac{m_1 + 2n_1}{m + 2n} + \frac{m_1(a^2 - 1)}{2m}\right) \quad \text{Equation 49}$$

The total sequence current at the fault, as a function of the zero-sequence current change at the relay, is expressed as:

$$IF = \frac{I0L - I0L_{pref}}{C0_{pob}} = \frac{\Delta I0L}{C0_{pob}} \quad \text{Equation 50}$$

The same can be done with respect to the positive-sequence and negative-sequence current changes at the relay:

$$IF = \frac{\Delta I2L}{C2_{pob}} = \frac{\Delta I1L}{C1_{pob}} \quad \text{Equation 51}$$

By replacing IF in Equation 43 by its function of the change of the zero-sequence current at the relay, the following expression is derived:

$$VAL = d \cdot ZL1 \cdot (IAL + K_0 \cdot I0L) + 3Rf \cdot \frac{\Delta I0L}{|C0_{pob}| \cdot e^{j\Psi_0}} \quad \text{Equation 52}$$

By multiplying both sides of Equation 52 by the conjugate of $(\Delta I0L \cdot e^{-j\Psi_0})$ and given that:

$$\mathrm{Im}\left(\frac{\Delta I0L \cdot conj(\Delta I0L \cdot e^{-j\Psi_0})}{|C0_{pob}| \cdot e^{j\Psi_0}}\right) = \mathrm{Im}\left(\frac{\Delta I0L^2}{|C0_{pob}|}\right) = 0 \quad \text{Equation 53}$$

The distance to the fault can be expressed as:

$$d = \frac{\mathrm{Im}[VAL \cdot conj(\Delta I0L \cdot e^{-j\Psi_0})]}{\mathrm{Im}[ZL1 \cdot I_{AG} \cdot conj(\Delta I0L \cdot e^{-j\Psi_0})]} \quad \text{Equation 54}$$

Alternatively, the distance to the fault can be expressed using the negative-sequence current as the polarizing quantity as follows:

$$d = \frac{\mathrm{Im}[VAL \cdot conj(\Delta I2L \cdot e^{-j\Psi_2})]}{\mathrm{Im}[ZL1 \cdot I_{AG} \cdot conj(\Delta I2L \cdot e^{-j\Psi_2})]} \quad \text{Equation 55}$$

Similarly, the distance to the fault can be expressed using the positive-sequence current as the polarizing quantity as follows:

$$d = \frac{\mathrm{Im}[VAL \cdot conj(\Delta I1L \cdot e^{-j\Psi_1})]}{\mathrm{Im}[ZL1 \cdot I_{AG} \cdot conj(\Delta I1L \cdot e^{-j\Psi_1})]} \quad \text{Equation 56}$$

Any of Equations 54, 55, and 56 can be used to calculate the distance to the fault using data from one terminal (i.e., single-end fault location). The prefault sequence current can be used along with a compensating tilt angle. The current distribution factor relative to each sequence current may be investigated to select the best choice to provide the most accurate distance calculation.

Figure 4:
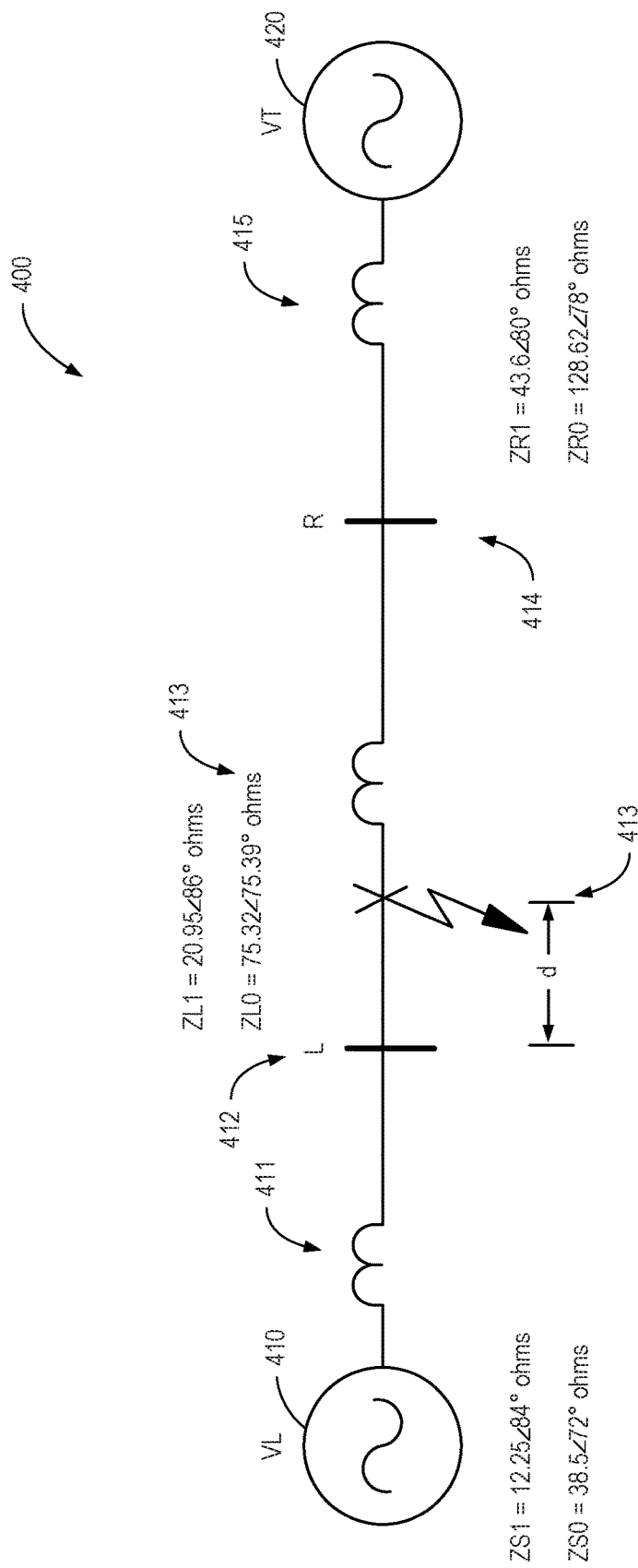
FIG. 4 illustrates a simplified diagram of an example single-line power system with a fault at a location, d.

FIG. 4 illustrates a diagram of a simplified single-line power system 400 with a fault at a location d. The single-line power system is modeled as a voltage VL 410 connected to a transmission line with an impedance ZS1 of 12.25∠84° and ZS0 of 38.5∠72° 411 between the power source VL 410 and a left bus L 412. The transmission line may have an impedance ZL1 of 20.95∠86° and ZL0 of 75.32∠75.39° 413 between the left bus L 412 and a right bus R 414. A fault location 413 a distance d from the left bus L 412 is shown as well. The transmission line may have an impedance ZR1 of 43.6∠80° and ZR0 of 128.62∠78° between the right bus R 414 and a voltage VT 420.

The example power system 400 is a 60 km, 120 kV line with a phase-A-to-ground fault applied at a time t=100 ms at 66.66 percent of the line length with phase B open and a primary fault resistance of 50 Ohms. FIGS. 5-11 relate to a comparison of single-ended fault location calculation using normal-mode approaches and the pole-open approach described above. The graphs shown in FIGS. 5-10 are from a simulation of voltage and current waveforms acquired at a rate of 16 samples per cycle (960 Hz) and processed through a full-cycle cosine filter to calculate the corresponding phasors.

Figure 5:
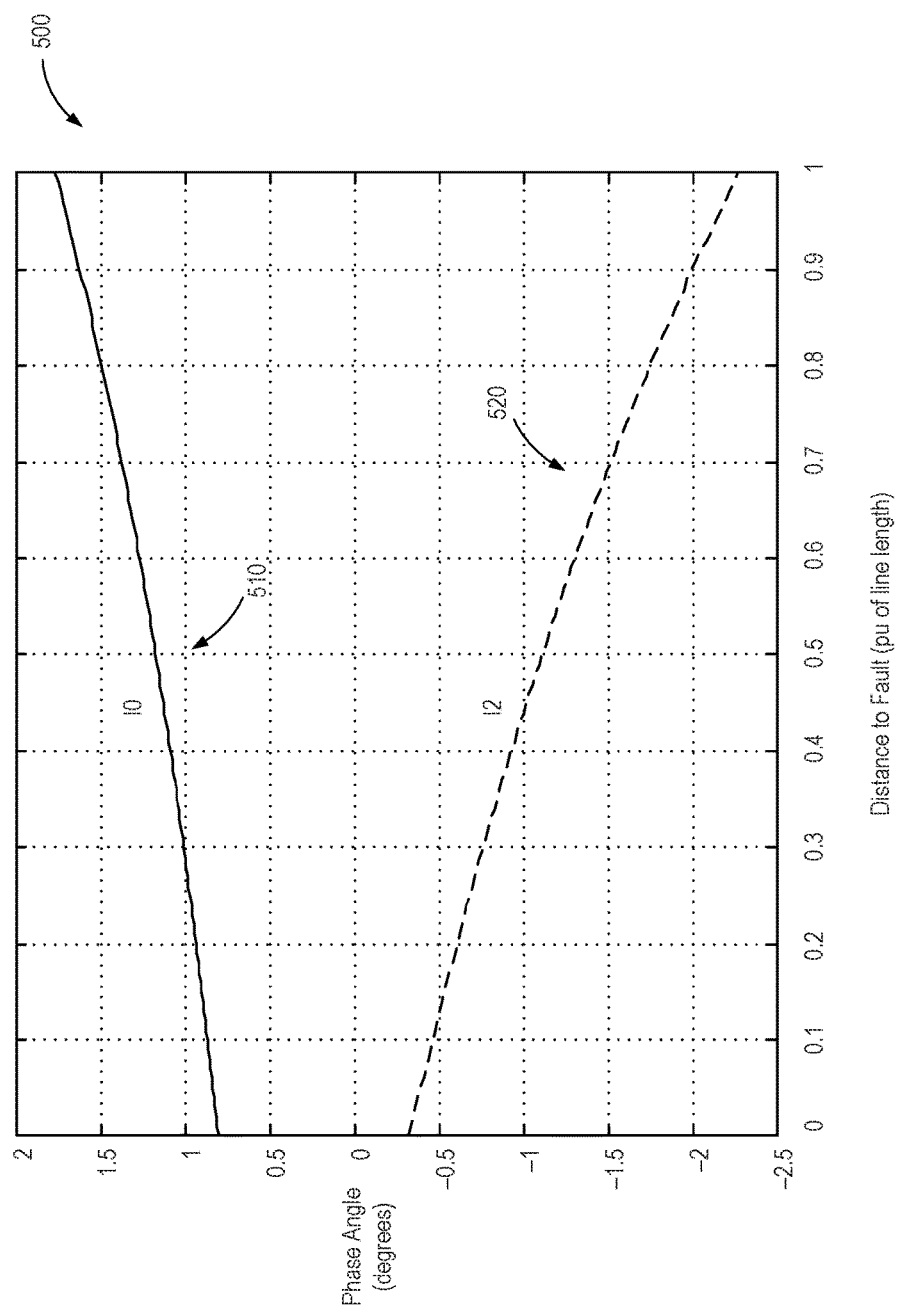
FIG. 5 illustrates a graph of the normal-mode current distribution factors for the example single-line power system of FIG. 4.

FIG. 5 illustrates a graph 500 of a plurality of normal-mode current distribution factors I0 510 and I2 520 for the single-line power system of FIG. 4. For the normal-mode calculations, a single tilt angle corresponding to phase angles of C1 and C0 at the mid-distance, or d=0.5 pu. At d=0.5 pu, the angles chosen may be:

$$\phi_0 = 1.1721°$$

$$\phi_2 = -1.1132°$$

Using these tilt angles and introducing these values for the normal-mode calculations, the time loci of the distance to the fault can be calculated using either the negative-sequence or zero-sequence currents as the polarizing quantities.

Figure 6:
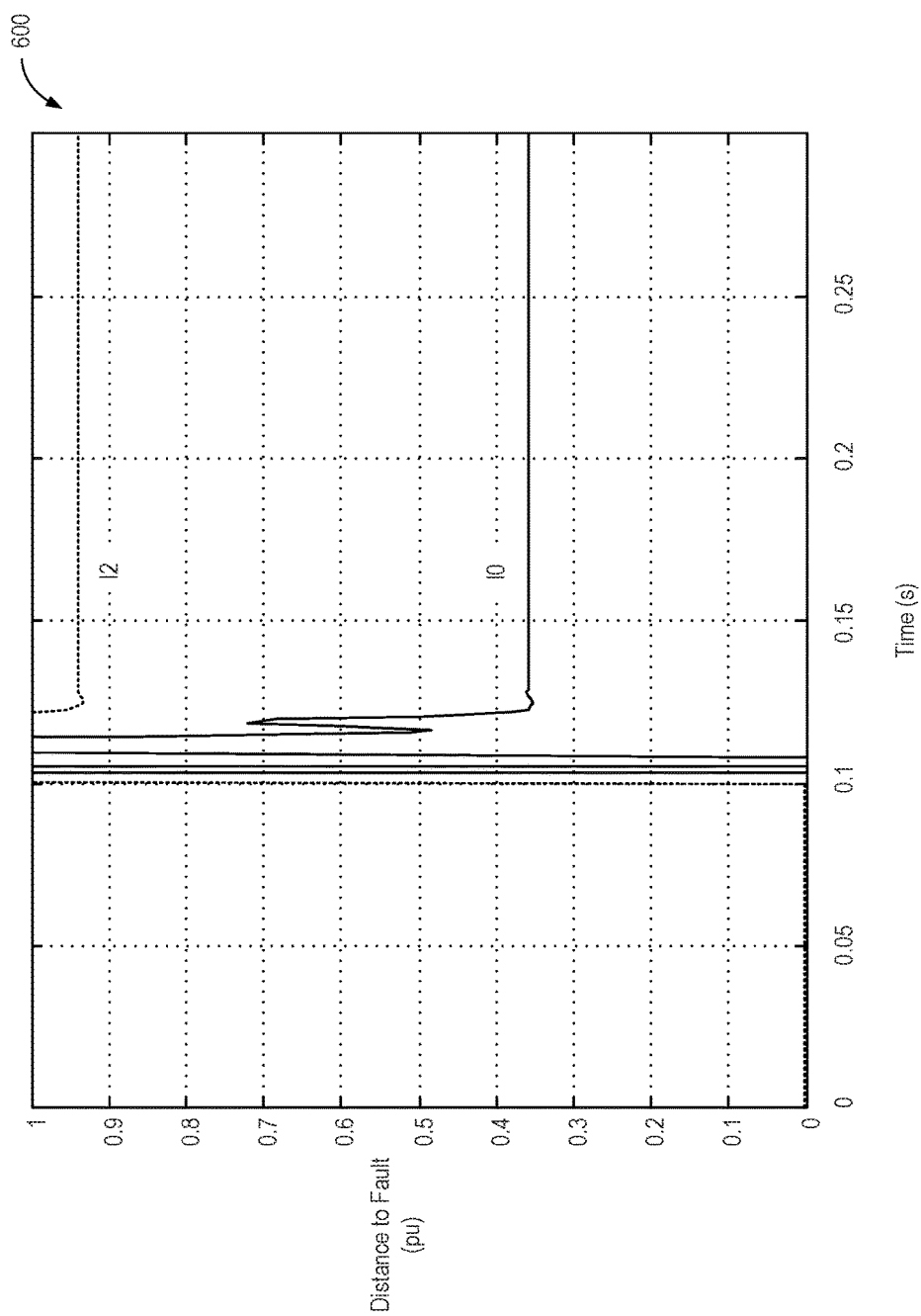
FIG. 6 illustrates distance calculation errors when using normal-mode distance calculations with zero-sequence (solid line) and negative-sequence (dashed line) polarization during the open-pole fault condition in FIG. 4.

FIG. 6 illustrates distance calculation errors when using normal-mode distance calculations with a zero-sequence I0 (solid line) and a negative-sequence I2 (dashed line) polarization during the open-pole fault condition in the single-line power system of FIG. 4.

FIG. 6 shows that the zero-sequence polarization provides an error of about 46 percent (0.36 pu instead of 0.666 pu for the distance [d]) and the negative-sequence polarization ends up with an error of 41 percent (fault location at 0.94 pu instead of 0.666 pu).

Figure 7:
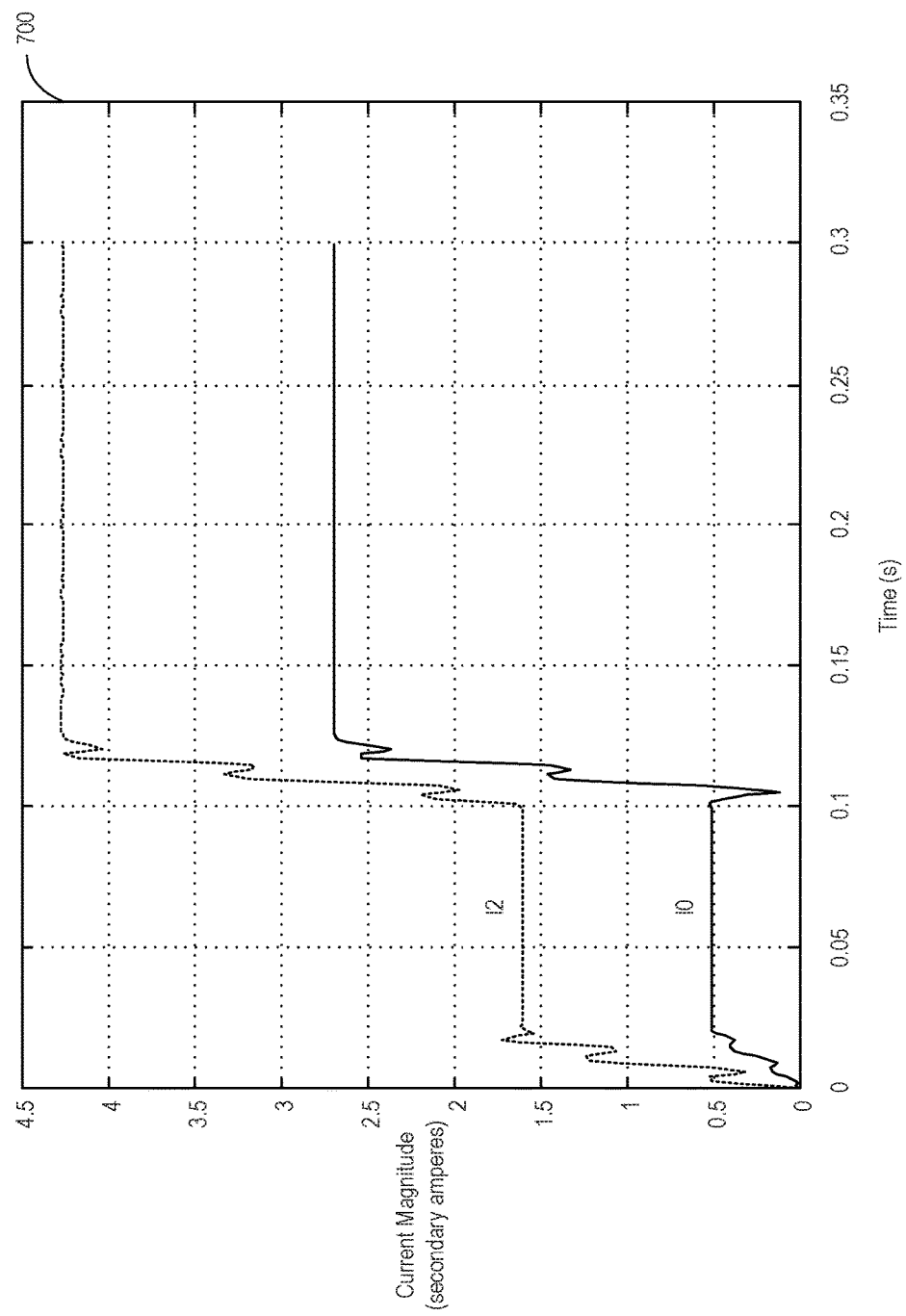
FIG. 7 illustrates that the reason that the normal-mode distance calculation approaches in FIG. 6 for the single-line power system of FIG. 4 are inaccurate is because the pre-fault zero-sequence and negative-sequence currents are non-negligible.

FIG. 7 illustrates that the reason that the normal-mode distance calculation approaches in FIG. 6 for the single-line power system of FIG. 4 are inaccurate is because the pre-fault zero-sequence and negative-sequence currents are non-negligible. Specifically, FIG. 7 shows that both the zero-sequence and negative-sequence currents are significant before the fault at about 100 ms.

Thus, the normal-mode approach to calculating a distance to a fault may provide an erroneous distance calculation for a pole-open transmission line system. Accordingly, in various embodiments, a system for determining a fault location may calculate a distance using the dual-sequence, pole-open approaches described herein.

Figure 8:
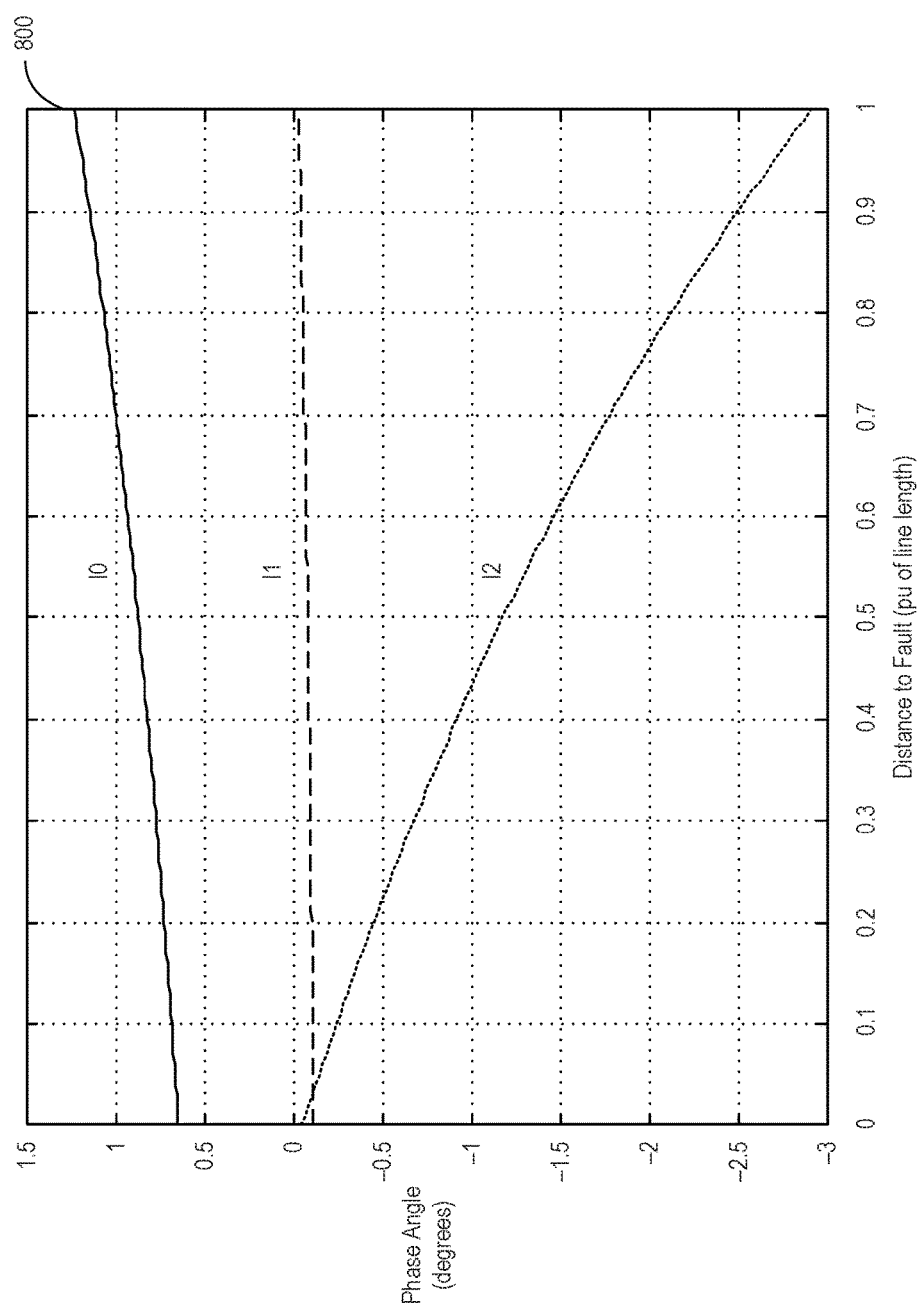
FIG. 8 illustrates the variation of the current distribution factor phase angles for each of the zero-sequence, positive-sequence, and negative-sequence currents for the open-pole fault condition in FIG. 4.

FIG. 8 illustrates the variation of a plurality of current distribution factor phase angles 800 for each of a zero-sequence I0, a positive-sequence I1, and a negative-sequence I2 current for the open-pole fault condition in FIG. 4. In the illustrated embodiment, it is readily apparent that the positive-sequence current I1 provides the best result because it has the least variation of the phase angle over the distance range of 0 to 1 pu, followed by the zero-sequence current I0. The last choice would be the negative-sequence current I2 because it has the largest variation of the phase angles. In each case, a tilt angle can be selected that corresponds to the mid-range distance value of 0.5 pu, or:

$$\psi_1 = -0.0836°$$

$$\psi_2 = -1.1826°$$

$$\psi_3 = 0.8721°$$

Figure 9:
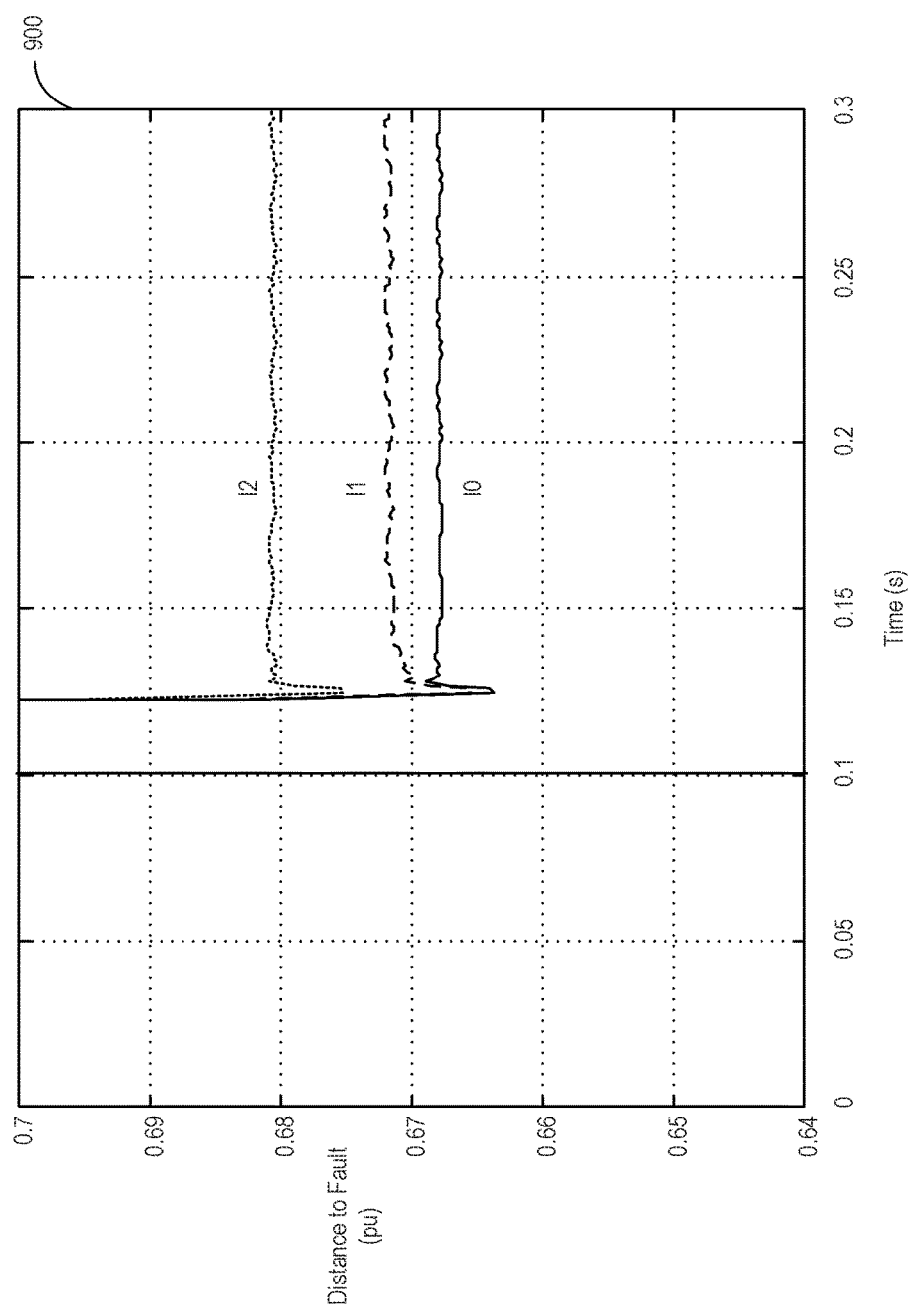
FIG. 9 illustrates a single-ended fault location calculation following a phase B pole-open condition using the two sequence network calculation approach described herein.

FIG. 9 illustrates a single-ended fault location calculation 900 following a phase B pole-open condition using the pole-open, two-sequence calculation approach described herein. The zero-sequence current polarization provides the best result, although the positive-sequence current polarization fault location might also prove to be an adequate selection. The polarization using the negative-sequence current provides the worst fault location and relative average error, although it is still below 2.3 percent (0.6807 pu measured against the true value of 0.666 pu). The zero-sequence current polarization has an average relative error of 0.3 percent (0.668 pu measured). The positive-sequence current polarization has an average error of 0.9 percent (0.672 pu measured). All three results are much better than the normal-mode calculations.

The phase angle of the negative-sequence current distribution factor as a function of the distance, d, to the fault can be curve-fitted with high accuracy using a third order polynomial:

$$\psi_2(d) = -0.5015 \cdot d^3 - 0.4387 \cdot d^2 - 1.9232 \cdot d - 0.0475 \qquad \text{Equation 57}$$

The distance to the fault can also be computed by representing the tilt angle as a function of the distance to the fault:

$$d = \frac{\text{Im}[VAL \cdot conj(\Delta I2L) \cdot e^{-j\psi_2(d)}]}{\text{Im}[ZL1 \cdot I_{AG} \cdot conj(\Delta I2L) \cdot e^{-j\psi_2(d)}]} \qquad \text{Equation 58}$$

In some embodiments, an iterative process is utilized that starts with a tilt angle of zero to iteratively calculate the distance, d. The distance, d, can then be used to compute a new tilt angle using the polynomial curve-fit equation above. The process is iteratively repeated until the error is within a predefined tolerance.

Figure 10:
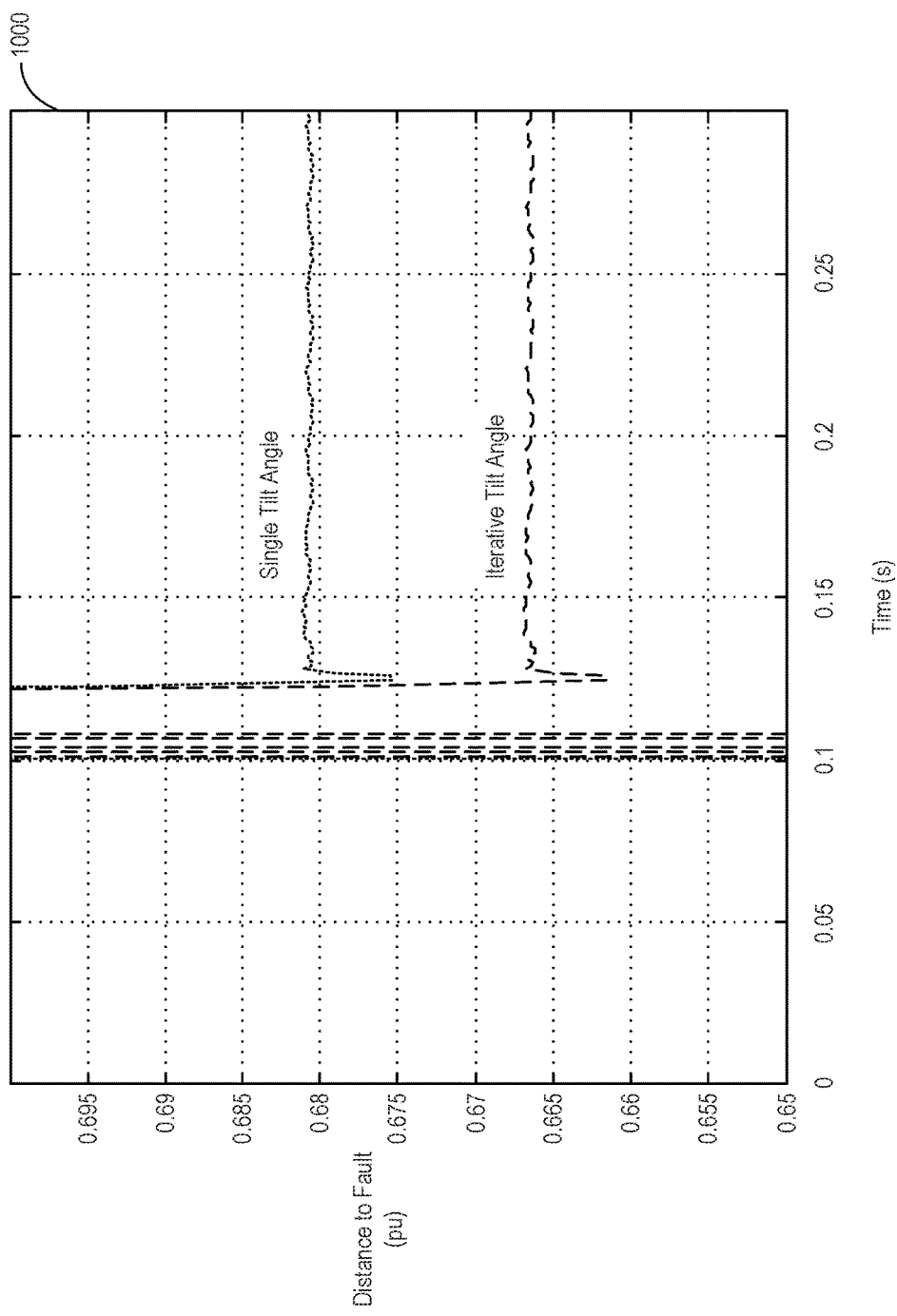
FIG. 10 illustrates a graphical representation of a fault location calculation following a phase B pole-open condition using an iterative two sequence network calculation approach with a polynomial approximation of the tilt angle.

FIG. 10 illustrates a graphical representation 1000 of a fault location calculation following a phase B pole-open condition using an iterative dual-sequence network calculation approach with a polynomial approximation of the tilt angle. As illustrated, the iterative approach allows a distance to be calculated with practically no error.

It is appreciated that in some instances the iterative fault location method may not be practical as it utilizes a precise knowledge of the network parameters and particularly the source impedances. While this may not always be possible, the example shows the factors impacting the single-ended fault location and shows what is possible with an ideal single-ended fault location method.

Figure 11:
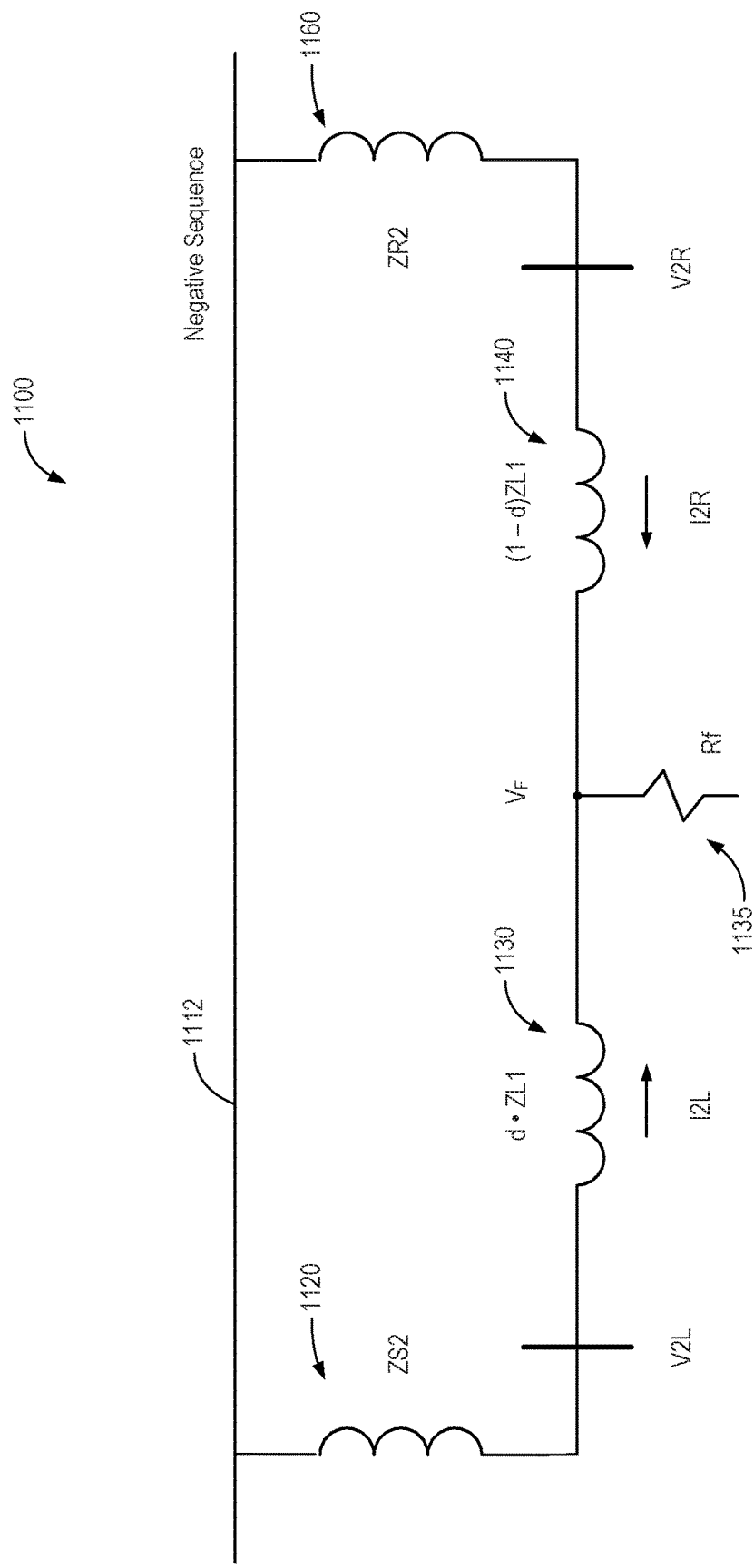
FIG. 11 illustrates a simplified diagram of a negative-sequence network, according to one embodiment.

FIG. 11 illustrates a simplified diagram of a negative-sequence network 1100, according to one embodiment. The network includes a line 1112 with a left side impedance ZS2 1120, a left side fault impedance 1130, a fault resistance 1135, a right side fault impedance 1140, and a right side impedance 1160. Using data from both the right and left side, a doubled-ended fault location approach may be utilized.

Double-ended fault location may be applied by using the negative-sequence network in normal mode. Assuming synchronous sampling at both line terminals and given that the voltage drop between the left and right bus and VF is the same, the following expression can be used:

$$V2L - I2L \cdot d \cdot ZL1 = V2R - (1-d) \cdot ZL1 \cdot I2R \quad \text{Equation 59}$$

An equation for the fault location, d, assuming that all poles are closed can be expressed as:

$$d = \frac{(V2L - V2R) + ZL1 \cdot I2R}{ZL1 \cdot (I2L + I2R)} \quad \text{Equation 60}$$

A similar equation for the pole-open configuration with phase B pole-open, as illustrated in the negative-sequence network shown in FIG. 3, can be expressed as:

$$d = \frac{(V2L - V2R) + ZL1(I2R - a \cdot I1R) - a(V1L - V1R)}{ZL1(I2L - I2R) - a \cdot ZL1(I1L + I1R)} \quad \text{Equation 61}$$

As illustrated in Equation 62, the distance for the pole-open condition involves voltages and currents from two sequence networks. Specifically, the distance for the pole-open condition includes both the positive-sequence and negative-sequence networks. The double-ended fault location during a phase A pole-open condition can be expressed as:

$$d = \frac{(V2L - V2R) + ZL1(I2R - I1R) - (V1L - V1R)}{ZL1(I2L - I2R) - ZL1(I1L + I1R)} \quad \text{Equation 62}$$

Similarly, the double-ended fault location method for a phase C pole-open condition can be expressed as:

$$d = \frac{(V2L - V2R) + ZL1(I2R - a^2 \cdot I1R) - a^2(V1L - V1R)}{ZL1(I2L - I2R) - a^2 \cdot ZL1(I1L + I1R)} \quad \text{Equation 63}$$

In Equations 61, 62, and 63, a represents the conventional complex operator $1\angle 120°$.

By using a generic complex operator, $\alpha$, that represents a 1 for a phase A open-pole, $1\angle 120°$ for a phase B open-pole, and $(1\angle 120°)^2$ for a phase C open-pole, the dual sequence, double-ended fault location algorithm can be expressed in two ways. A first way is represented below by Equation 64:

$$d = \frac{(V2L - V2R) + ZL1(I2R - \alpha I1R) - \alpha(V1L - V1R)}{ZL1(I2L + I2R) - \alpha ZL1(I1L + I1R)} \quad \text{Equation 64}$$

Alternatively, the distance calculation may be represented by the incremental equation below:

$$d = \frac{(\Delta V2L - \Delta V2R) + ZL1(\Delta I2R - \alpha \Delta I1R) - \alpha(\Delta V1L - \Delta V1R)}{ZL1(\Delta I2L + \Delta I2R) - \alpha ZL1(\Delta I1L + \Delta I1R)} \quad \text{Equation 65}$$

In Equations 65, the distance can be found using incremental positive (or negative) sequence voltage and/or current phasors. The incremental voltage or current phasor is the voltage or current phasor during the fault after subtracting the same voltage or current phasor before the fault. In each of these situations, a pole is open before the fault occurs. Accordingly, the negative sequence voltage or current phasor will not be a zero phasor. Therefore, using "preflt" to signify a pre-fault state, the following are used in Equations 65:

$$\Delta V2L = V2L - V2L_{preflt}$$

$$\Delta I2L = I2L - I2L_{preflt}$$

$$\Delta V1L = V1L - V1L_{preflt}$$

$$\Delta I1L = I1L - I1L_{preflt}$$

$$\Delta V2R = V2R - V2R_{preflt}$$

$$\Delta I2R = I2R - I2R_{preflt}$$

$$\Delta V1R = V1R - V1R_{preflt}$$

$$\Delta I1R = I1R - I1R_{preflt}$$

Figure 12:
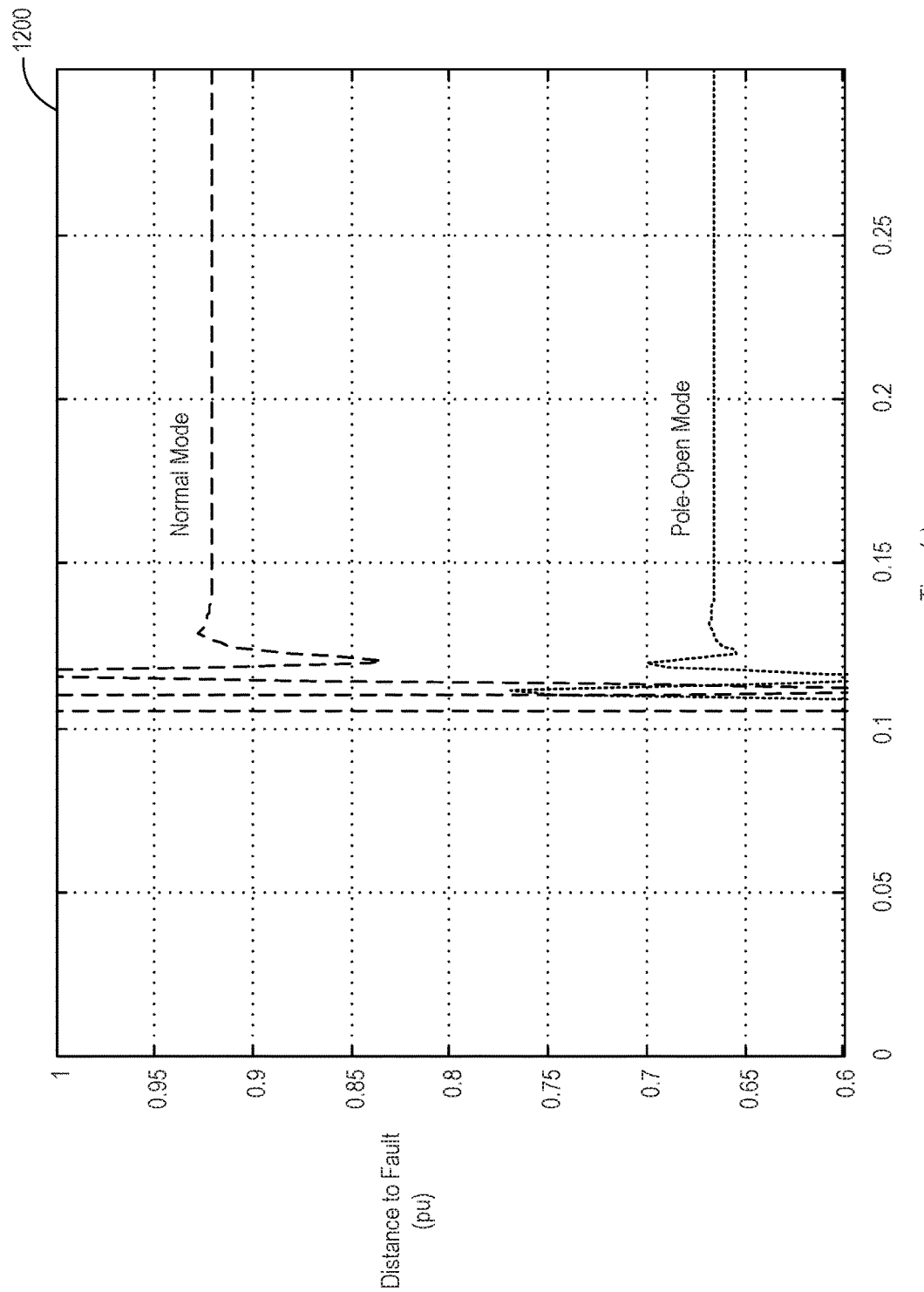
FIG. 12 illustrates a graphical representation of a fault location calculation of the single-line power system in FIG. 4 using a double-ended normal-mode approach and the double-ended pole-open approach (dual-sequence approach).

FIG. 12 illustrates a graphical representation 1200 of a fault location calculation of the single-line power system in FIG. 4 using a double-ended normal-mode approach and the double-ended pole-open approach (two-sequence approach). The illustration assumes a fault resistance of 20 Ohms on a 120 kV system with a phase-C-to-ground fault with phase B open at 66 percent of the line length. Given that the actual fault distance is 0.666 pu, it is readily apparent from FIG. 12 that the pole-open, dual-sequence approach is far superior to the normal-mode approach for pole-open fault conditions.

Figure 13:
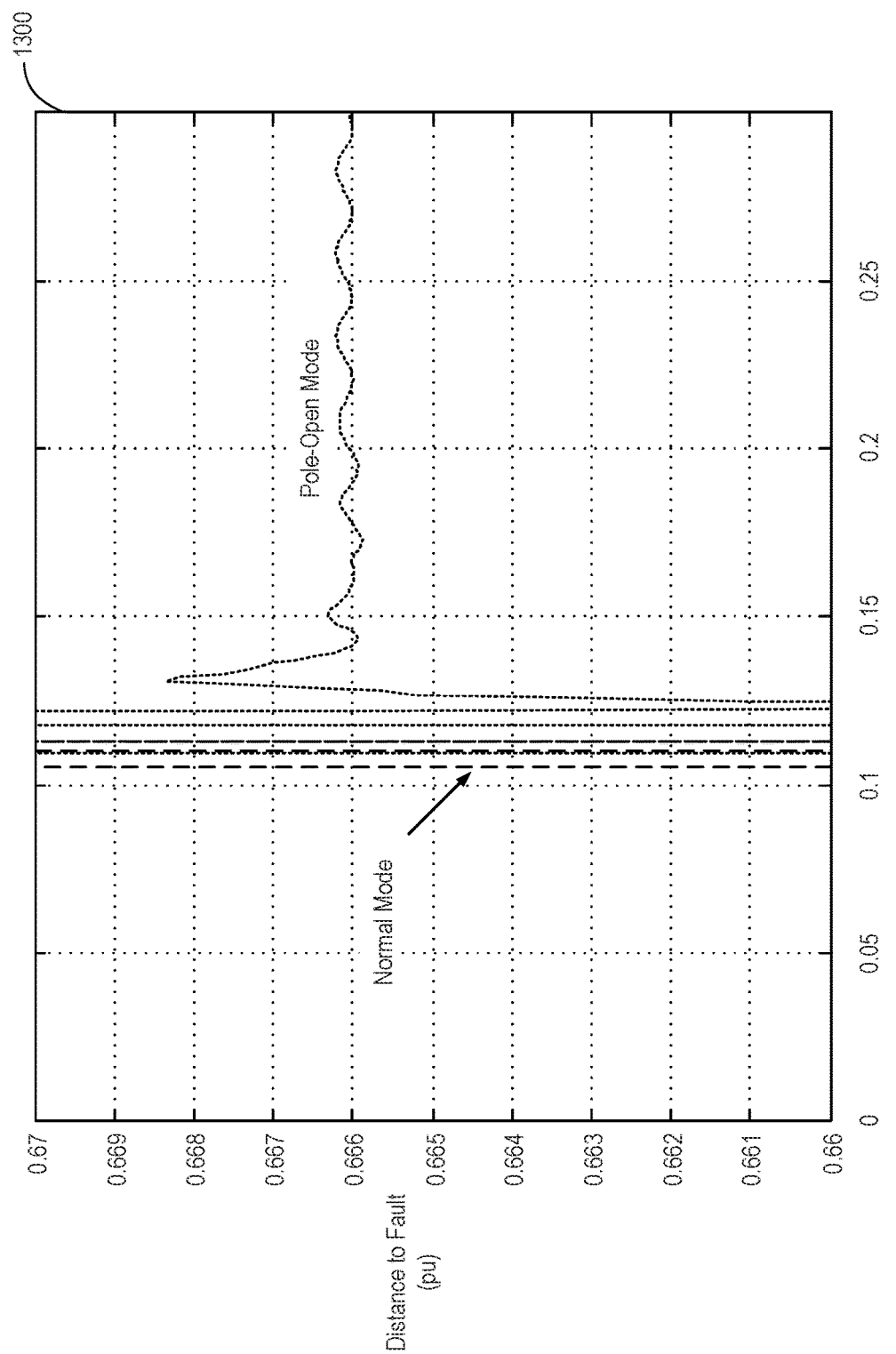
FIG. 13 illustrates a close-up view of FIG. 12 to better illustrate the accuracy of the pole-open, dual-sequence approach.

FIG. 13 illustrates a close-up view 1300 of FIG. 12 to better illustrate the accuracy of the pole-open, dual-sequence approach. The relative error is approximately 0.5 percent for the illustrated example.

Figure 14:
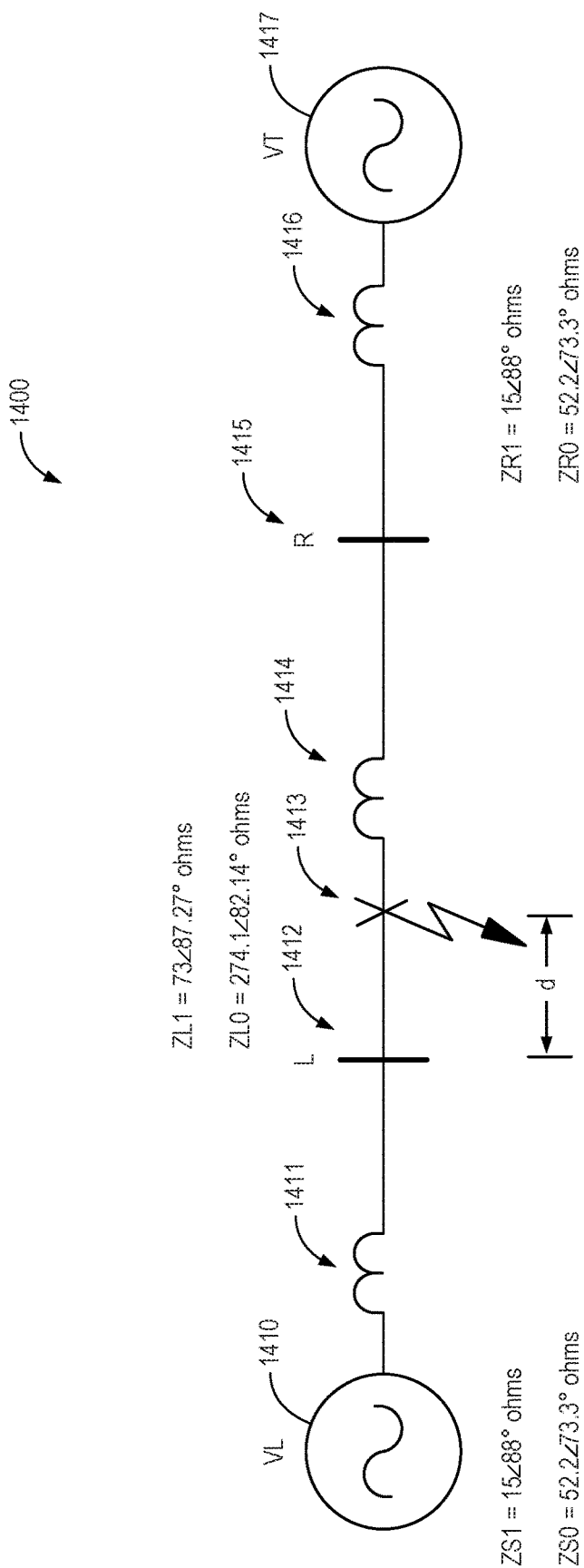
FIG. 14 illustrates another example diagram of a single-line power system with a fault at a location d, according to one embodiment.

FIG. 14 illustrates another example diagram of a single-line power system 1400 with a fault at a location d, according to one embodiment. The single-line power system is modeled as a voltage VL 1410 connected to a transmission line with an impedance ZS1 of $15\angle 88°$ and ZS0 of $52.2\angle 73.3°$ 1411 between the power source VL 1410 and a left bus L 1412. The transmission line may have an impedance ZL1 of $73\angle 87.27°$ and ZL0 of $274.1\angle 82.14°$ 1414 between the left bus L 1412 and a right bus R 1415. A fault location 1413 a distance d from the left bus L 1412 is shown as well. The transmission line may have an impedance ZR1 of $15\angle 88°$ and ZR0 of $52.2\angle 73.3°$ between the right bus R 1415 and a voltage VT 1417.

The example power system 1400 is a 200 km, 500 kV line with a phase-C-to-ground fault applied at a time t=100 ms at 66.66 percent of the line length with phase B open and a primary fault resistance of 20 Ohms. FIGS. 5-11 relate to a comparison of single-ended fault location calculation using normal-mode approaches and the pole-open approach described above. The graphs shown in FIGS. 5-10 are from a simulation of voltage and current waveforms acquired at a rate of 16 samples per cycle (960 Hz) and processed through a full-cycle cosine filter to calculate the corresponding phasors.

Figure 15:
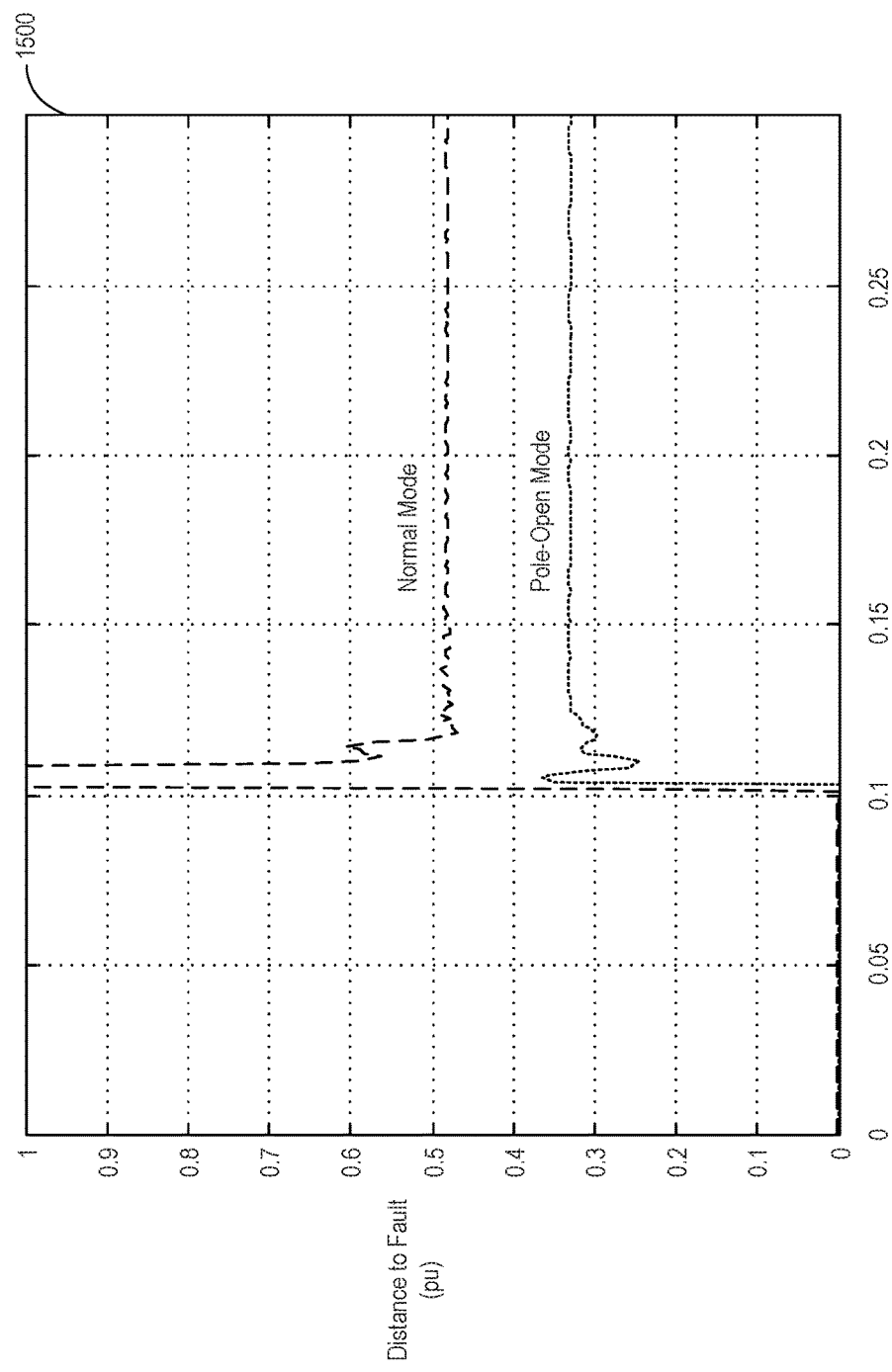
FIG. 15 illustrates another graphical representation showing the improved accuracy of the pole-open, dual-sequence approach as compared to the normal-mode approach.

FIG. 15 illustrates a graphical representation 1500 showing the improved accuracy of the double-ended pole-open, dual-sequence approach as compared to the double-ended normal-mode approach for the system in which a fault occurs with phase C open.

Figure 16:
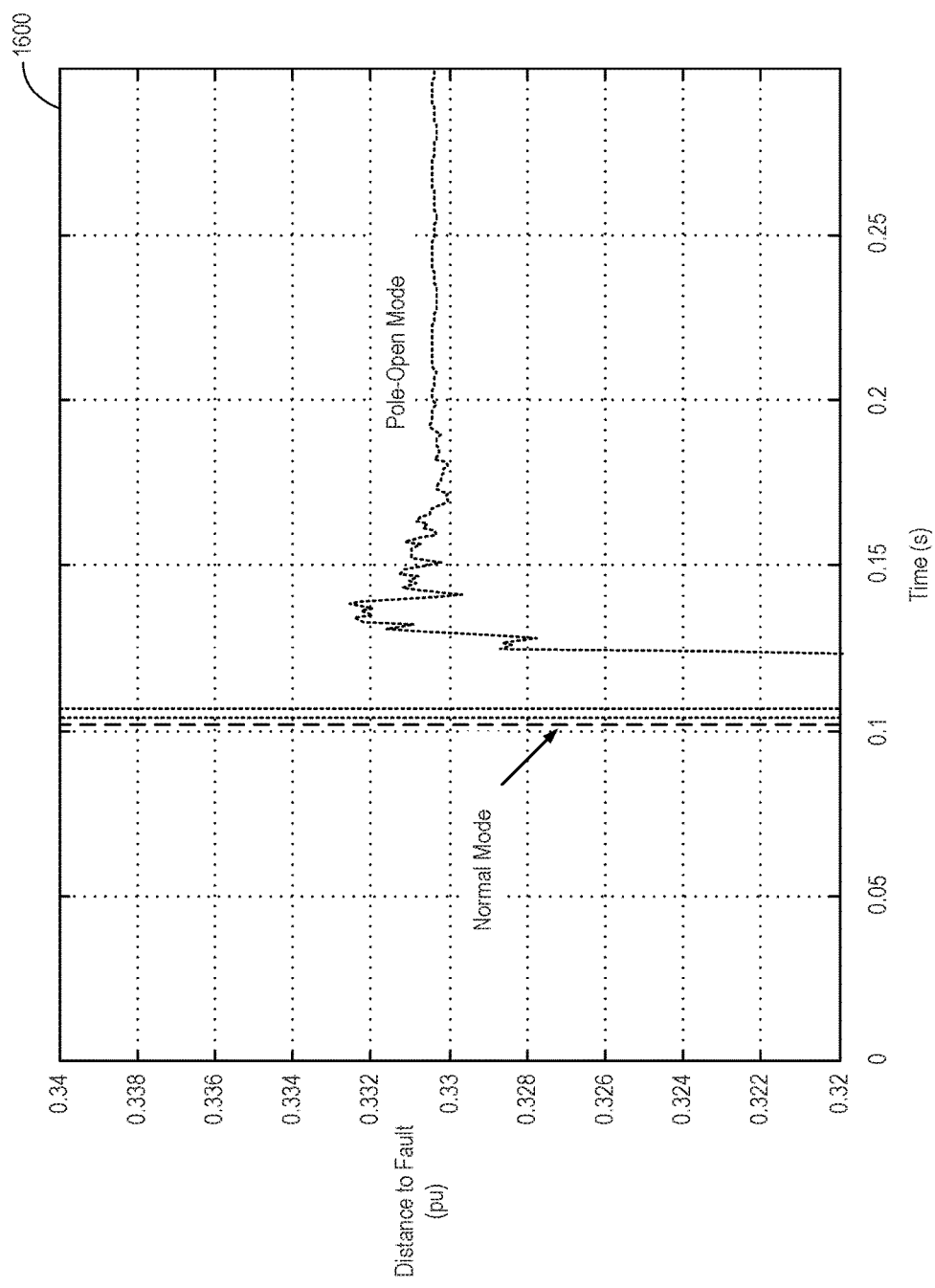
FIG. 16 illustrates a close-up view of FIG. 15 to better illustrate the absolute accuracy of the pole-open, dual-sequence approach.

FIG. 16 illustrates a close-up view 1600 of FIG. 15 to better illustrate the absolute accuracy of the pole-open, dual-sequence approach. Again, the relative error is less than 0.5 percent for the illustrated example.

Figure 17:
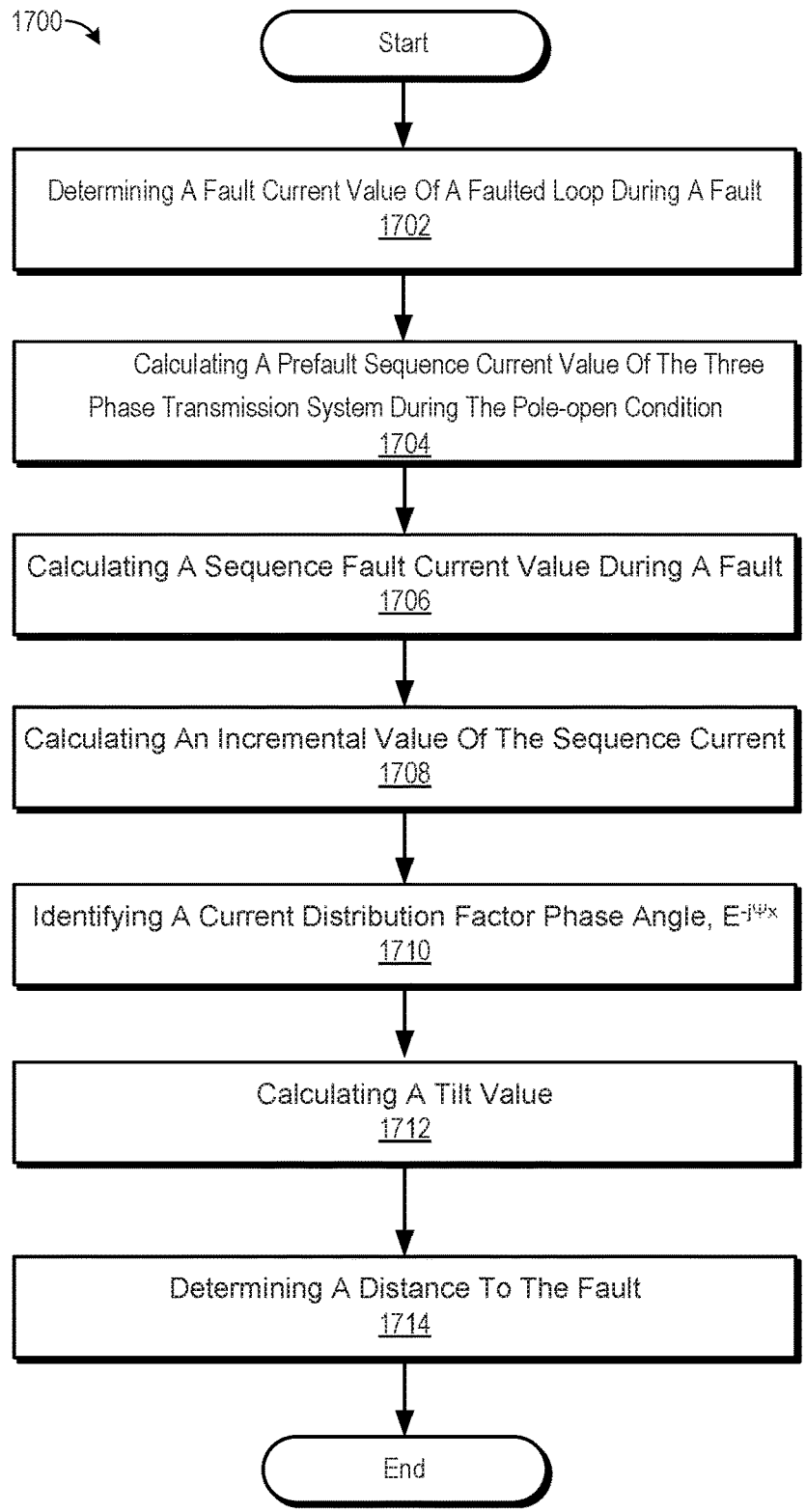
FIG. 17 illustrates a flow chart of a method for dual-sequence, single-ended fault location calculation, according to one embodiment.

FIG. 17 illustrates a flow chart of a method 1700 for dual-sequence, single-ended fault location calculation, according to one embodiment. Many of the steps may be implemented in any order. However, as illustrated, a first step may include determining, at 1702, fault current value, $I_{AG}$, of a faulted loop during a fault. A prefault sequence current value, $IXL_{pref}$, may be calculated 1704, for the three-phase transmission system during the pole-open condition. Subsequently, a system may calculate 1706 a sequence fault current value, IXL, during a fault. An incremental value of the sequence current, $\Delta IXL$, may be calculated 1708 that corresponds to the difference between the prefault sequence current value, $IXL_{pref}$, and the sequence fault current value, IXL.

The system may then identify 1710 a current distribution factor phase angle, $e^{-j\psi x}$, based on impedance values of at least two sequence networks (e.g., a positive-sequence network, a negative-sequence network, and/or a zero-sequence network).

The system may then calculate 1712 a tilt value corresponding to a conjugate of a product of the incremental value of the sequence current, $\Delta IXL$, and the current distribution factor phase angle, $e^{-j\psi x}$. A distance to the fault may then be determined 1714 based on the quotient of (a) an imaginary portion of a product of the voltage of the faulted loop, VAL, and the tilt value divided by (b) an imaginary portion of a product of a positive-sequence impedance, ZL1, the fault current value, $I_{AG}$, and the tilt value.

Figure 18:
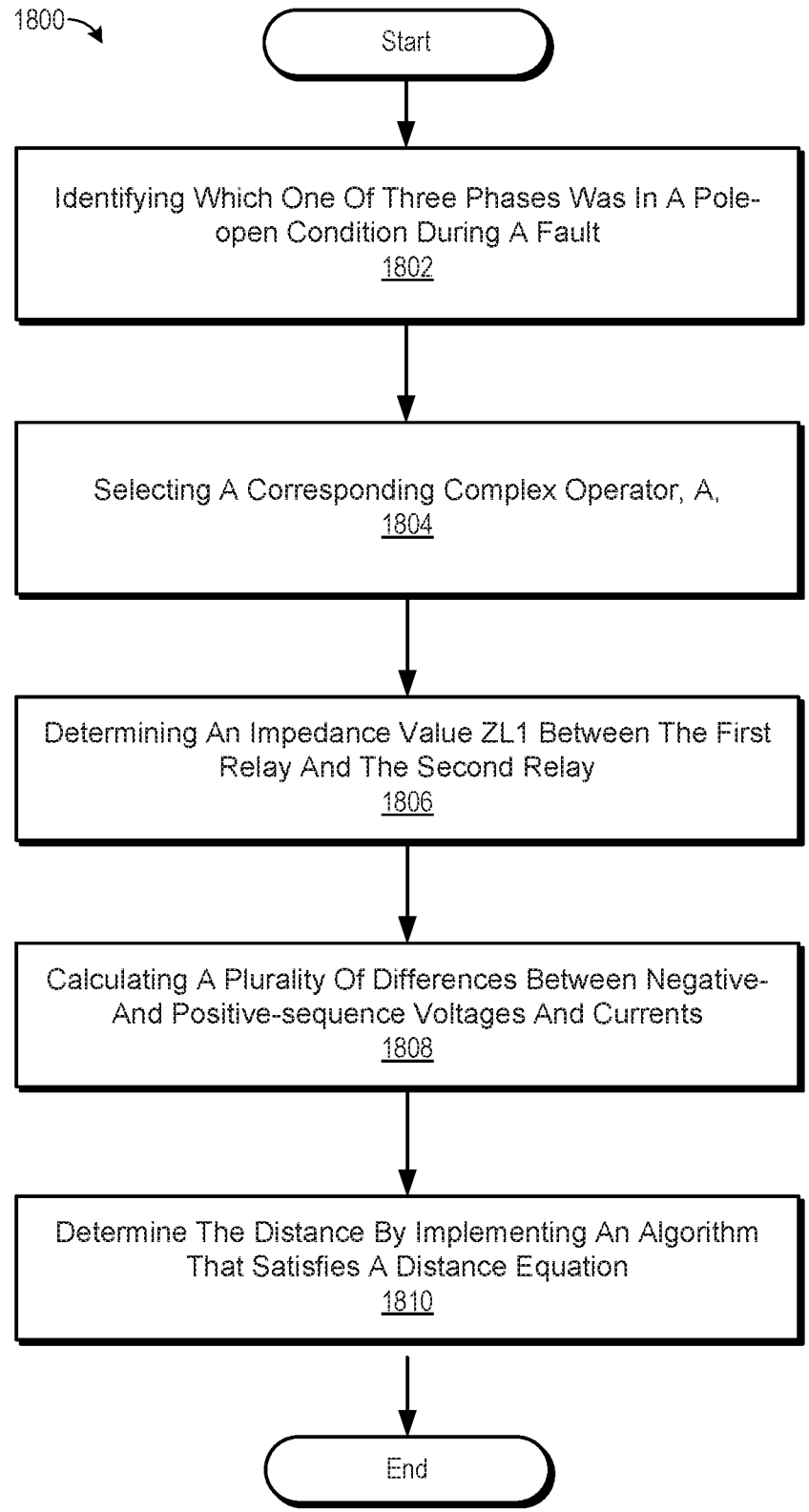
FIG. 18 illustrates a flow chart of a method for dual-sequence, double-ended fault location calculation, according to one embodiment.

FIG. 18 illustrates a flow chart of a method 1800 for dual-sequence, double-ended fault location calculation, according to one embodiment. A system may be configured to identify 1802 which one of three phases was in a pole-open condition during a fault between a first relay and a second relay. A complex operator, α, may be selected 1804, where the complex operator, α, is equal to 1 for a phase A open-pole, $1\angle 120°$ for a phase B open-pole, and $(1\angle 120°)^2$ for a phase C open-pole. An impedance value ZL1 may be calculated or measured, at 1806.

While variations of the exact order and variables may be possible, the illustrated method shows a plurality of differences (and sums) between negative- and positive-sequence voltages and currents 1808, including: a difference between a negative-sequence voltage, V2L, at the first relay and a negative-sequence voltage, V2R, at the second relay; a difference between a negative-sequence current, I2R, at the second relay and a positive-sequence current, I1R, at the second relay; a difference between a positive-sequence voltage, V1L, at the first relay and a positive-sequence voltage, V1R at the second relay; a sum of a negative-sequence current, I2L, at the first relay and a negative-sequence current, I2R, at the second relay; and a sum of the positive-sequence current, I1L, at the first relay and a positive-sequence current, I1R, at the second relay.

Finally, a distance to the fault may be determined 1810 by implementing an algorithm that satisfies an equation:

$$d = \frac{(V2L - V2R) + ZL1(I2R - \alpha I1R) - \alpha(V1L - V1R)}{ZL1(I2L + I2R) - \alpha ZL1(I1L + I1R)}.$$

Alternatively, the distance to the fault may be determined by implementing an algorithm that satisfies an equation:

$$d = \frac{(\Delta V2L - \Delta V2R) + ZL1(\Delta I2R - \alpha\Delta I1R) - \alpha(\Delta V1L - \Delta V1R)}{ZL1(\Delta I2L + \Delta I2R) - \alpha ZL1(\Delta I1L + \Delta I1R)}.$$

Thus, systems and/or methods may be constructed that calculate a distance to a fault based on double-ended data that implements a distance calculation algorithm that satisfies at least one of (1)

$$d = \frac{(V2L - V2R) + ZL1(I2R - \alpha I1R) - \alpha(V1L - V1R)}{ZL1(I2L + I2R) - \alpha ZL1(I1L + I1R)} \text{ and}$$

$$d = \frac{(\Delta V2L - \Delta V2R) + ZL1(\Delta I2R - \alpha\Delta I1R) - \alpha(\Delta V1L - \Delta V1R)}{ZL1(\Delta I2L + \Delta I2R) - \alpha ZL1(\Delta I1L + \Delta I1R)},$$

as described above.

Figure 19:
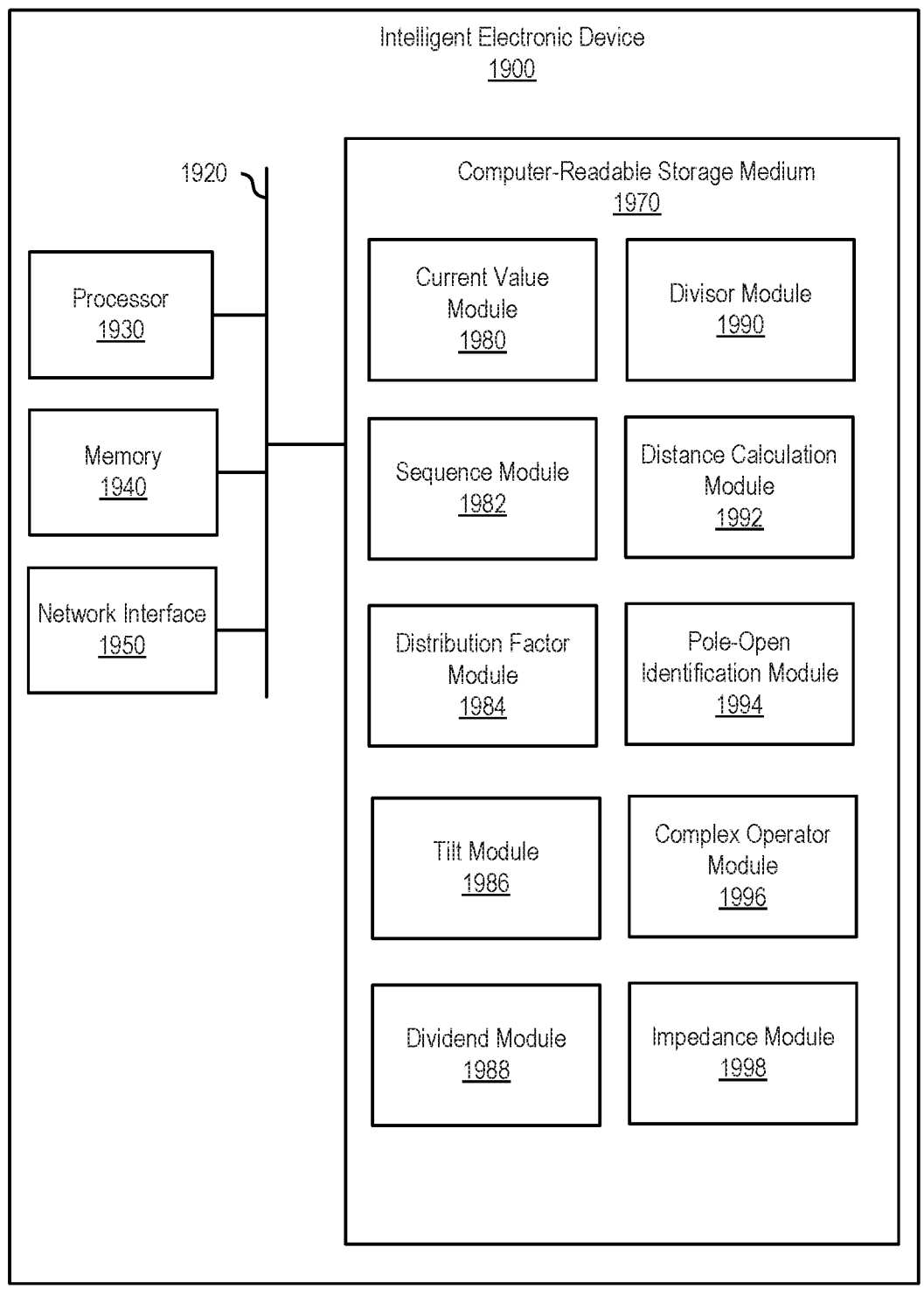
FIG. 19 illustrates an IED for performing single-ended or double-ended fault location calculation, according to one embodiment.

FIG. 19 illustrates an IED 1900 for performing single-ended or double-ended fault location calculations, according to various embodiments. The IED includes a bus 1920 connecting a processor 1930 or processing unit(s) to a memory 1940, a network interface 1950, and a computer-readable storage medium 1970. The computer-readable storage medium 1970 may include or interface with software, hardware, or firmware modules for implementing various portions of the systems and methods described herein. The separation of the modules is merely an example and any combination of the modules or further division may be possible.

A current value module 1980 may include or interface with one or more current sensors and be configured to determine a current value before, after, or during a fault event. A sequence module 1982 may be configured to calculate negative-, positive-, and/or zero-sequence currents. A distribution factor module 1984 may be configured to determine a current distribution factor phase angle, $e^{-j\psi x}$, based on impedance values of at least two sequence networks. A tilt module 1986 may be configured to calculate a tilt value corresponding to a conjugate of a product of the incremental value of the sequence current, $\Delta IXL$, and the current distribution factor phase angle, $e^{-j\psi x}$.

A dividend module 1988 may be configured to calculate a distance dividend corresponding to an imaginary portion of a product of the voltage of the faulted loop, VAL, and the tilt value. A divisor module 1990 may be configured to calculate a distance divisor corresponding to an imaginary portion of a product of a positive-sequence impedance, ZL1, the fault current value, $I_{AG}$, and the tilt value. A distance determination or calculation module 1992 may be configured to determine a distance to the fault corresponding to a quotient of the distance dividend and the distance divisor.

A pole-open identification module 1994 may be configured to identify which one of three phases was in a pole-open condition during a fault between the first relay and the second relay. A complex operator module 1996 may be configured to identify a complex operator, α, corresponding to the pole-open phase, where the complex operator, α, is equal to 1 for a phase A open-pole, 1∠120° for a phase B open-pole, and (1∠120°)² for a phase C open-pole. Finally, an impedance module 1998 may be configured to determine an impedance, ZL1, between the first relay and the second relay.

This disclosure has been made with reference to various embodiments, including the best mode. However, those skilled in the art will recognize that changes and modifications may be made to the embodiments without departing from the scope of the present disclosure. While the principles of this disclosure have been shown in various embodiments, many modifications of structure, arrangements, proportions, elements, materials, and components may be adapted for a specific environment and/or operating requirements without departing from the principles and scope of this disclosure. These and other changes or modifications are intended to be included within the scope of the present disclosure.

This disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element. The scope of the present invention should, therefore, be determined by the following claims:

What is claimed:

1. A single-ended fault location determination system, comprising:
   one or more computer-readable storage media;
   a processor operatively coupled to the one or more computer-readable storage media, wherein the processor is configured to:
      determine current values on at least two phase lines of a three-phase transmission system during a pole-open condition;
      determine a fault current value, $I_{AG}$, of a faulted loop during a fault;
      determine a prefault sequence current value, $IXL_{pref}$ of the three-phase transmission system during the pole-open condition;
      determine a sequence fault current value, IXL, during the fault, wherein an incremental value of the sequence current, ΔIXL, corresponds to the difference between the prefault sequence current value, $IXL_{pref}$ and the sequence fault current value, IXL;
      determine a current distribution factor phase angle, $e^{-j\psi x}$, based on impedance values of at least two sequence networks;
      calculate a tilt value corresponding to a conjugate of a product of the incremental value of the sequence current, ΔIXL, and the current distribution factor phase angle, $e^{-j\psi x}$;
      calculate a distance dividend corresponding to an imaginary part of a product of the voltage of the faulted loop, VAL, and the tilt value;
      calculate a distance divisor corresponding to an imaginary part of a product of a positive-sequence impedance, ZL1, the fault current value, $I_{AG}$, and the tilt value;
      determine a distance to the fault corresponding to a quotient of the distance dividend and the distance divisor; and
      provide the distance to the fault during the pole-open condition by utilizing the at least two sequence networks of the three-phase transmission system to compensate for a voltage potential across an open pole of the three-phase transmission system.

2. The system of claim 1, wherein the prefault sequence current value, $IXL_{pref}$, comprises a prefault zero-sequence current value $I0L_{pref}$ and wherein the sequence fault current value, IXL, comprises a zero-sequence current value I0L, such that the incremental value of the sequence current, ΔIXL, comprises an incremental value of the zero-sequence current ΔI0L, and the current distribution factor phase angle, $e^{-j\psi x}$, is a zero-sequence current distribution factor phase angle, $e^{-j\psi 0}$.

3. The system of claim 1, wherein the prefault sequence current value, $IXL_{pref}$, comprises a prefault positive-sequence current value $I1L_{pref}$ and wherein the sequence fault current value, IXL, comprises a positive-sequence current value I1L, such that the incremental value of the sequence current, ΔIXL, comprises an incremental value of the positive-sequence current ΔI1L, and the current distribution factor phase angle, $e^{-j\psi x}$, is the positive-sequence current distribution factor phase angle, $e^{-j\psi 1}$.

4. The system of claim 1, wherein the prefault sequence current value, $IXL_{pref}$ comprises a prefault negative-sequence current value $I2L_{pref}$ and wherein the sequence fault current value, IXL, comprises a negative-sequence current value I2L, such that the incremental value of the sequence current, ΔIXL, comprises an incremental value of the negative-sequence current ΔI2L, and the current distribution factor phase angle, $e^{-j\psi x}$, is the negative-sequence current distribution factor phase angle, $e^{-j\psi 2}$.

5. The system of claim 1, wherein the current distribution factor phase angle, $e^{-j\psi x}$, is based on impedance values of a positive-sequence network of the three-phase transmission system and a zero-sequence network of the three-phase transmission system.

6. The system of claim 1, wherein the current distribution factor phase angle, $e^{-j\psi x}$, is based on impedance values of a negative-sequence network of the three-phase transmission system and a zero-sequence network of the three-phase transmission system.

7. The system of claim 1, wherein the current distribution factor phase angle, $e^{-j\psi x}$, is based on impedance values of a negative-sequence network of the three-phase transmission system and a positive-sequence network of the three-phase transmission system.

8. The system of claim 1, wherein the current distribution factor phase angle, $e^{-j\psi x}$, is further made a function of the distance, d, to the fault and wherein the distance, d, is solved through an iterative polynomial curve-fitting algorithm.

9. The system of claim 1, wherein the voltage of the faulted loop, VAL, is measured using a voltage meter.

10. A method, comprising:
   determining, via at least one current sensor, a fault current value, $I_{AG}$, of a faulted loop during a fault;
   calculating a prefault sequence current value, $IXL_{pref}$ of a three-phase transmission system during a pole-open condition, and calculating a sequence fault current value, IXL, during a fault, calculating an incremental value of the sequence current, ΔIXL, corresponding to the difference between the prefault sequence current value, $IXL_{pre}$, and the sequence fault current value, IXL;

identifying a current distribution factor phase angle, $e^{-j\psi x}$, based on impedance values of at least two sequence networks selected from the group of sequence networks consisting of a positive-sequence network, a negative-sequence network, and a zero-sequence network;

calculating a tilt value corresponding to a conjugate of a product of the incremental value of the sequence current, ΔIXL, and the current distribution factor phase angle, $e^{-j\psi x}$;

determining a distance to the fault based on the quotient of (a) an imaginary part of a product of the voltage of the faulted loop, VAL, and the tilt value divided by (b) an imaginary part of a product of a positive-sequence impedance, ZL1, the fault current value, $I_{AG}$, and the tilt value; and provide the distance to the fault during the pole-open condition, wherein the provided distance to the fault utilizes the impedance values of the at least two sequence networks to compensate for a voltage potential across an open pole of the three-phase transmission system.

11. The method of claim 10, wherein phase B is in a pole-open condition during the fault such that α is equal to 1∠120°.

12. The method of claim 10, further comprising:
reporting the calculated distance to the fault as a range based on an estimated error percentage.

13. A method, comprising:
identifying which one of three phases of a three-phase transmission system was in a pole-open condition during a fault between a first relay and a second relay;

selecting a corresponding complex operator, α, where the complex operator, α, is equal to 1 for a phase A open-pole, 1∠120° for a phase B open-pole, and (1∠120°)² for a phase C open-pole;

determining an impedance value ZL1 between the first relay and the second relay;

calculating a difference between a negative-sequence voltage, V2L, at the first relay and a negative-sequence voltage, V2R, at the second relay;

calculating a difference between a negative-sequence current, I2R, at the second relay and a positive-sequence current, I1R, at the second relay;

calculating a difference between a positive-sequence voltage, V1L, at the first relay and a positive-sequence voltage, V1R, at the second relay;

calculating a sum of a negative-sequence current, I2L, at the first relay and a negative-sequence current, I2R, at the second relay;

calculating a sum of the positive-sequence current, I1L, at the first relay and a positive-sequence current, I1R, at the second relay;

determining a distance to the fault by implementing an algorithm that at least approximately satisfies at least one of two distance equations:

$$d = \frac{(V2L - V2R) + ZL1(I2R - \alpha I1R) - \alpha(V1L - V1R)}{ZL1(I2L + I2R) - \alpha ZL1(I1L + I1R)}, \text{ and} \quad (1)$$

$$d = \frac{(\Delta V2L - \Delta V2R) + ZL1(\Delta I2R - \alpha \Delta I1R) - \alpha(\Delta V1L - \Delta V1R)}{ZL1(\Delta I2L + \Delta I2R) - \alpha ZL1(\Delta I1L + \Delta I1R)}; \quad (2)$$

and providing an indication of where the fault occurred during the pole-open condition, wherein the distance to the fault utilizes at least two sequence networks to compensate for a voltage potential across an open pole of the three-phase transmission system.

14. A non-transitory computer-readable medium with instructions stored thereon that, when executed by a processor, cause an intelligent electronic device (IED) to perform operations comprising:

receiving data from at least one of a first relay and a second relay indicating which one of three phases was in a pole-open condition during a fault between the first relay and the second relay;

selecting a corresponding complex operator, α, where the complex operator, α, is equal to 1 for a phase A open-pole, 1∠120° for a phase B open-pole, and (1∠120°)² for a phase C open-pole;

identifying an impedance value ZL1 between the first relay and the second relay;

calculating a difference between a negative-sequence voltage, V2L, at the first relay and a negative-sequence voltage, V2R, at the second relay;

calculating a difference between a negative-sequence current, I2R, at the second relay and a positive-sequence current, I1R, at the second relay;

calculating a difference between a positive-sequence voltage, V1L, at the first relay and a positive-sequence voltage, V1R, at the second relay;

calculating a sum of a negative-sequence current, I2L, at the first relay and a negative-sequence current, I2R, at the second relay;

calculating a sum of the positive-sequence current, I1L, at the first relay and a positive-sequence current, I1R, at the second relay;

determining a distance to the fault by implementing an algorithm that at least approximately satisfies at least one of two distance equations:

$$d = \frac{(V2L - V2R) + ZL1(I2R - \alpha I1R) - \alpha(V1L - V1R)}{ZL1(I2L + I2R) - \alpha ZL1(I1L + I1R)}, \text{ and} \quad (1)$$

$$d = \frac{(\Delta V2L - \Delta V2R) + ZL1(\Delta I2R - \alpha \Delta I1R) - \alpha(\Delta V1L - \Delta V1R)}{ZL1(\Delta I2L + \Delta I2R) - \alpha ZL1(\Delta I1L + \Delta I1R)}; \quad (2)$$

and providing the distance to the fault during the pole-open condition by utilizing at least two sequence networks of the three-phase transmission system to compensate for a voltage potential across an open pole of the one of the three phases in the pole-open condition.

15. An intelligent electronic device, comprising
a pole-open identification module to identify which one of three phases was in a pole-open condition during a fault between the first relay and the second relay;
a complex operator determination module to identify a complex operator, α, corresponding to the pole-open phase, where the complex operator, α, is equal to 1 for a phase A open-pole, $1\angle 120°$ for a phase B open-pole, and $(1\angle 120°)^2$ for a phase C open-pole;

an impedance module to determine an impedance, ZL1, between the first relay and the second relay;

a processing unit to:

calculate a difference between a negative-sequence voltage, V2L, at the first relay and a negative-sequence voltage, V2R, at the second relay;

calculate a difference between a negative-sequence current, I2R, at the second relay and a positive-sequence current, I1R, at the second relay;

calculate a difference between a positive-sequence voltage, V1L, at the first relay and a positive-sequence voltage, V1R, at the second relay;

calculate a sum of a negative-sequence current, I2L, at the first relay and a negative-sequence current, I2R, at the second relay;

calculate a sum of the positive-sequence current, I1L, at the first relay and a positive-sequence current, I1R, at the second relay;

determine a distance to the fault by implementing an algorithm that at least approximately satisfies at least one of two distance equations:

$$d = \frac{(V2L - V2R) + ZL1(I2R - \alpha I1R) - \alpha(V1L - V1R)}{ZL1(I2L + I2R) - \alpha ZL1(I1L + I1R)}, \text{ and} \quad (1)$$

$$d = \frac{(\Delta V2L - \Delta V2R) + ZL1(\Delta I2R - \alpha\Delta I1R) - \alpha(\Delta V1L - \Delta V1R)}{ZL1(\Delta I2L + \Delta I2R) - \alpha ZL1(\Delta I1L + \Delta I1R)}; \quad (2)$$

and provide the distance to the fault during the pole-open condition by utilizing at least two sequence networks of the three-phase transmission system to compensate for a voltage potential across an open pole of the one of the three phases in the pole-open condition.

16. The system of claim 15, wherein the pole identification module comprises a sensor configured to measure one of a voltage, a resistance, and a current to measure which of the three phases is in a pole-open condition.

17. The system of claim 15, wherein the impedance module is configured to measure the impedance, ZL1, between the first relay and the second relay.

18. The system of claim 15, wherein the impedance module is configured to calculate the impedance, ZL1, between the first relay and the second relay based on stored information regarding the three-phase transmission system.

19. The system of claim 15, wherein the processing unit is further configured to calculate the voltage across the open pole of the phase in the open-pole condition.

20. The system of claim 15, wherein phase C is in an open-pole condition such that the complex operator, $\alpha$, is equal to $(1\angle 120°)^2$.

21. The system of claim 15, wherein the implemented algorithm satisfies the distance equation $$d = \frac{(\Delta V2L - \Delta V2R) + ZL1(\Delta I2R - \alpha\Delta I1R) - \alpha(\Delta V1L - \Delta V1R)}{ZL1(\Delta I2L + \Delta I2R) - \alpha ZL1(\Delta I1L + \Delta I1R)},$$

and wherein each delta ($\Delta$) value represents an incremental difference between a fault value and a pre-fault value.

* * * * *